United States Patent
Hoshino

(10) Patent No.: US 8,354,630 B2
(45) Date of Patent: Jan. 15, 2013

(54) A/D CONVERTER CIRCUIT AND SOLID-STATE IMAGING DEVICE HAVING SERIES-CONNECTED CAPACITATIVE ELEMENTS WITH PLURAL INPUT CIRCUITS

(75) Inventor: Kozo Hoshino, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 353 days.

(21) Appl. No.: 12/865,604

(22) PCT Filed: Jan. 30, 2009

(86) PCT No.: PCT/JP2009/051534
§ 371 (c)(1),
(2), (4) Date: Jul. 30, 2010

(87) PCT Pub. No.: WO2009/099003
PCT Pub. Date: Aug. 13, 2009

(65) Prior Publication Data
US 2011/0001039 A1    Jan. 6, 2011

(30) Foreign Application Priority Data
Feb. 7, 2008    (JP) .................................. 2008-027689

(51) Int. Cl.
*H01J 40/14*    (2006.01)
(52) U.S. Cl. .................................. 250/214 R; 250/208.1
(58) Field of Classification Search .............. 250/214 R, 250/208.1; 341/155, 156, 141–145, 122; 348/272–283, 294–308
See application file for complete search history.

(56) References Cited

U.S. PATENT DOCUMENTS
7,230,558 B2 *   6/2007   Lim .............................. 341/155

FOREIGN PATENT DOCUMENTS
| JP | 56-096527 |   | 8/1981 |
| JP | 11-168383 | A | 6/1999 |
| JP | 2000-286706 | A | 10/2000 |
| JP | 2002-232291 | A | 8/2002 |
| JP | 2005-348325 | A | 12/2005 |

* cited by examiner

*Primary Examiner* — Que T Le
(74) *Attorney, Agent, or Firm* — Edwards Wildman Palmer LLP; David G. Conlin; Stephen D. LeBarron

(57) ABSTRACT

Provided are a solid-state imaging device and A/D converter circuit comprising: series-connected capacitative elements; a voltage comparator circuit comparing the output of the capacitative element C1 with a threshold voltage; a first input circuit inputting an analog voltage signal to the node between the capacitative elements C1 and C2; a second input circuit inputting a first reference voltage, monotonously changing in a first conversion process for finding the upper-order bit value, to the node between the capacitative elements C2 and C3; a third input circuit inputting a second reference voltage, monotonously changing in a second conversion process for finding an unconverted bit value after the first conversion process, to the input terminal of the capacitative element C3; and a control circuit generating a control signal to hold the first reference voltage in the capacitative element C3 when the output of the voltage comparator circuit changes in the first conversion process.

10 Claims, 16 Drawing Sheets ns and Solid-State Imaging Device Having Series-Connected Capacitive Elements With Plural Input Circuits

A/D CONVERTER CIRCUIT AND SOLID-STATE IMAGING DEVICE HAVING SERIES-CONNECTED CAPACITIVE ELEMENTS WITH PLURAL INPUT CIRCUITS

CROSS-REFERENCE TO RELATED APPLICATIONS

This application is a National Phase filing under 35 U.S.C. §371 of International Application No. PCT/JP2009/051534 filed on Jan. 30, 2009, and which claims priority to Japanese Patent Application No. 2008-027689 filed on Feb. 7, 2008.

TECHNICAL FIELD

The present invention relates to an A/D converter circuit to convert an analog signal to a digital signal and more particularly, to a column-parallel A/D converter circuit provided in a solid-state imaging device in which a plurality of solid-state imaging elements each to convert an optical signal to an electric signal are arranged in the form of a matrix, and mounted on the same chip as the solid-state imaging elements.

BACKGROUND ART

On some solid-state imaging devices each provided with a solid-state imaging element group in which a plurality of solid-state imaging elements (unit pixel) to convert an optical signal to an electric signal by photoelectron conversion are arranged in the form of a matrix, such as a CMOS imaging sensor, CCD sensor, near-infrared imaging sensor, or far-infrared imaging sensor, an analog circuit and a digital circuit are mounted on the same chip.

The circuit mounted on the same chip as the solid-state imaging element group includes, for example, a column-parallel A/D converter circuit in which an A/D converter is provided with respect to each column of the solid-state imaging element group, and pixels in one row are read at one time. Since the column-parallel A/D converter circuit can read the data in one row at one time, its reading speed is high as compared with a conventional A/D converter which is not the column-parallel A/D converter, or its reading speed can be at the same level as the conventional A/D converter which is not the column-parallel A/D converter, at a lower operation frequency, so that power consumption can be lowered.

The general column-parallel A/D converter circuit includes, for example, a column-parallel A/D converter circuit (refer to patent document 1, for example) which is composed of a ramp voltage generator circuit to generate a reference voltage (ramp voltage) whose voltage value monotonously increases in a conversion process to convert an analog voltage signal outputted from the solid-state imaging element to digital data, and a counter circuit to output a counted digital value in response to a voltage change of the ramp voltage, and compares the analog voltage signal with a reference voltage signal in synchronization with an counting operation of the counter circuit, and stores a counter value as pixel data when a comparison result is inverted.

A brief description will be made of a configuration of a solid-state imaging device provided with the column-parallel A/D converter disclosed in the patent document 1 with reference to FIG. 10. Here, FIG. 10 partially shows a schematic configuration example of the solid-state imaging device provided with the column-parallel A/D converter circuit disclosed in the patent document 1. In addition, it is assumed that a resolution (defined by the bit number) is 10 bits in the column-parallel A/D converter circuit shown in FIG. 10.

More specifically, as shown in FIG. 10, a solid-state imaging device 1000 disclosed in the patent document 1 is composed of a solid-state imaging element group IPD in which a plurality of solid-state imaging elements $PIX_{ij}$ (i=1 to m, j=1 to n) to convert an optical signal to an analog voltage signal Vpix are arranged in the form of a matrix, a vertical decoder VD to select a reading target row in a reading process, a ramp voltage generator circuit 1020 to generate a ramp voltage Vr whose voltage value increases step-by-step according to a counter value of a counter circuit 1040 to be described below in a conversion process to convert the analog voltage signal Vpix to digital data, the counter circuit 1040 to start counting when the voltage value of the ramp voltage Vr starts increasing, a horizontal decoder HD to select a reading target column in the reading process, a converter circuit group 1100 in which converter circuits 1101 to compare the analog voltage signal Vpix with the ramp voltage Vr, and output a signal Vcp' showing a comparison result are each provided with respect to each column of the solid-state imaging element group IPD, and a digital memory 1050 in which memory circuits 1051 are each provided with respect to each column of the solid-state imaging element group IPD. In addition, the column-parallel A/D converter circuit ADC is composed of the ramp voltage generator circuit 1020, the counter circuit 1040, the converter circuit group 1100, and the digital memory 1050.

The converter circuit 1101 is composed of a capacitive element 1105 having an input end to which the analog electric signal Vpix is inputted through a switch circuit 1102, a capacitive element 1104 having an output end connected to an intermediate node connecting the switch circuit 1102 to the capacitive element 1105 and an input end to which the ramp voltage Vr is inputted through a switch circuit 1103, a voltage comparator circuit 1106 composed of an inverter circuit having an input terminal connected to an output end of the capacitive element 1105 to compare a voltage value of the input terminal with a predetermined threshold voltage value, and a switch circuit 1107 to cause short circuit between an input terminal and an output terminal of the voltage comparator circuit 1106.

Hereinafter, a description will be made of an operation of the column-parallel A/D converter circuit ADC in the solid-state imaging device 1000 with reference to FIGS. 11 and 12.

Here, FIG. 11 shows waveforms of input and output voltage signals and operation states of switch circuits SW1' to SW3' in the converter circuit 1101 of the column-parallel A/D converter circuit ADC of the solid-state imaging device 1000 shown in FIG. 10. FIG. 12 shows a relationship among values of the ramp voltage Vr, and analog signal Vpix, and the counter circuit 1040 while the conversion process is executed. In addition, FIG. 12 shows a case where a resolution of the column-parallel A/D converter circuit ADC is 4 bits, the counter circuit 1040 counts $2^4=16$ times in a period Trc, and the voltage value of the ramp voltage Vr increases step-by-step by a unit increase amount in response to the counting operation. In addition, in FIG. 12, SW1' shows the state of the switch circuit 1102, SW2' shows the state of the switch circuit 1103, and SW3' shows the state of the switch circuit 1107.

When an imaging process is started at a time t0, an initialization process is started at a time t1. In the initialization process, a voltage Vrst of the solid-state imaging element PIX at a reset level is sampled.

More specifically, as shown in FIG. 11, a voltage value of the conversion object analog voltage signal Vpix outputted from the solid-state imaging element PIX is equal to the voltage Vrst at the reset level at the time t1, and a voltage value of the ramp voltage Vr is equal to a voltage Vr0 at an initial level. When the initialization process is started at the time t1, the converter circuit 1101 of the column-parallel AJD converter circuit ADC turns on the switch circuit 1102 and the switch circuit 1107, and turns off the switch circuit 1103. Thus, the voltage Vrst of the solid-state imaging element $PIX_{ij}$ at the reset level is inputted to the input end of the capacitative element 1105 (C1'), and short circuit is caused between the input terminal and the output terminal of the voltage comparator circuit 1106, and an inversion level Vth of the voltage comparator circuit 1106 is inputted to the output end of the capacitative element 1105 (C1'). Thus, characteristic variation in inversion level of the voltage comparator circuit 1106 is cancelled (auto-zero technique). Then, when the switch circuit 1107 is turned off at a time t2, a difference voltage between the voltage Vrst of the solid-state imaging element $PIX_{ij}$ at the reset level and the inversion level Vth of the voltage comparator circuit 1106 is held in the capacitative element 1105 (C1'), and the initialization process is completed.

At a time t3, a sampling process is started for a signal level Vsig of the solid-state imaging element $PIX_{ij}$ in an image loading process.

More specifically, at the time t3, the conversion object analog voltage signal Vpix whose voltage value is the voltage Vsig is outputted from the solid-state imaging element $PIX_{ij}$, and inputted to the input end of the capacitative element 1105 (C1'). In addition, at the time t3, the switch circuit 1103 (SW2') is turned on, and the ramp voltage Vr at the initial level Vr0 is inputted to the input end of the capacitative element 1104 (C2'). At a time t4, the sampling process for the signal level Vsig of the solid-state imaging element $PIX_{ij}$ is completed. When the switch circuit 1102 (SW1') is turned off at the time t4, a difference voltage between the signal level Vsig of the conversion object analog voltage signal Vpix and the initial level Vr0 of the ramp voltage Vr is held in the capacitative element 1104 (C2').

At a time t5, the conversion process to convert a difference voltage Va to digital data is started, and the ramp voltage Vr increases step-by-step in synchronization with a clock signal CLK, and the counter value of the counter circuit 1040 increases by one in response to the increase of the ramp voltage Vr.

More specifically, as shown in FIG. 12, the voltage value of the difference voltage Va is a value between the voltage value of the ramp voltage Vr corresponding to the counter value "1000" and the voltage value of the ramp voltage Vr corresponding to the counter value "1001". The counter circuit 1040 sequentially counts up from "0000" by one, and when the counter value changes from "1000" to "1001" at a time t6, a value of the signal Vcp' outputted from the voltage comparator circuit 1106 is changed (inverted) from H level to L level. When the value of the signal Vcp' is inverted, the memory circuit 1051 stores the counter value of the counter circuit 1040, that is, "1001" in FIG. 12. Then, the conversion process is completed at a time t7.

The following formula 1 and formula 2 express an input voltage Vin of the voltage comparator circuit 1106 in the column-parallel A/D converter circuit ADC disclosed in the patent document 1 with the inversion level Vth of the comparator circuit 1106, the initial level Vrst of the solid-state imaging element $PIX_{ij}$, the signal level Vsig of the solid-state imaging element $PIX_{ij}$ at the time of imaging operation, and the initial level Vr0 of the ramp voltage Yr.

$$Vin=Vr+(Vsig-Vr0)+(Vth-Vrst) \quad (1)$$

$$Vin-Vth=Vr-\{Vr0+(Vrst-Vsig)\} \quad (2)$$

Therefore, based on the formula 1, the formula 2, and FIG. 11, the ramp voltage Vr at the time of the output change of the voltage comparator circuit 1106, that is, when Vin-Vth=0 is expressed by the following formula 3.

$$Vr=Vr0+(Vrst-Vsig)=Vr0+Va$$

(provided that $Vin-Vth=0$) (3)

In addition, in the case of the column-parallel A/D converter circuit ADC disclosed in the patent document 1, the conversion process to convert the conversion object analog voltage signal Vpix to digital data D [(z−1):0] (z is the bit number of the digital data) requires a time for $2^z$ steps, that is, for the $2^z$ clocks because one step corresponds to one clock in general. More specifically, when the bit number z=10 in the digital data, a time for $2^{10}$=1024 clocks is required.

By the way, recently, the solid-state imaging device provided with the column-parallel A/D converter circuit is required to be higher in resolution and higher in resolution accuracy, so that various techniques are proposed to shorten a process time of the column-parallel A/D converter circuit.

The technique to shorten the process time of the column-parallel A/D converter circuit includes a sub-ranging method in which the digital data is divided to upper-order bits and lower-order bits, and the digital data is provided by a two-step conversion process composed of a first conversion process to convert the conversion object analog voltage signal to the digital data with a upper-order bit converting resolution based on the bit number of the upper-order bits, and a second conversion process to convert a difference voltage value between a voltage value corresponding to the conversion result of the first conversion process and a voltage value of the conversion object analog voltage signal, to the digital data with a lower-order bit converting resolution based on the bit number of the lower-order bits.

Hereinafter, a description will be made of a concept of a general operation of a conventional sub-ranging A/D converter circuit with reference to FIGS. 8 and 9. Here, FIG. 8 shows a relationship among a conversion object analog voltage signal Vpix, a voltage value corresponding to the upper-order bits found in the first conversion process, a difference voltage Vdif, and a voltage value corresponding to the digital data, in the general sub-ranging A/D converter circuit. FIG. 9 shows configurations of a first ramp voltage Vrc used in the first conversion process and a second ramp voltage Vrf used in the second conversion process. In addition, in FIGS. 8 and 9, it is assumed that the digital data is composed of 4 bits, and the first conversion process to find the upper-order 2 bits and the second conversion process to find the lower-order 2 bits are executed to simplify the description. In addition, a voltage Ver shown in FIG. 8 represents a quantizing error at the time of the A/D conversion process.

As shown in FIGS. 8 and 9, in order to find the upper-order 2 bits, the first conversion process uses the ramp voltage Vrc which monotonously increases by a first change amount Δ1 provided by dividing a voltage width Vfs of the conversion object analog voltage signal Vpix by split number 4 based on the resolution of 2 bits. In FIGS. 8 and 9, the conversion object analog voltage signal Vpix is provided between digital values "01" and "10" of the counter circuit, so that when the digital value of the counter circuit (corresponding to the counter circuit 1040 in FIG. 10) shifts to "10", an output value of the voltage comparator circuit (corresponding to the voltage comparator circuit 1106 in FIG. 10) is inverted. The counter value "10" at this time is the value of the upper-order bits, and the difference voltage value Vdif at this time is held as a process target of the second conversion process.

As shown in FIGS. 8 and 9, in order to find the lower-order 2 bits, the second conversion process uses the ramp voltage Vrf which monotonously decreases by a second change amount ΔV2 provided by dividing the first change amount ΔV1 by split number 4 based on the resolution of 2 bits. In FIGS. 8 and 9, the difference voltage value Vdif is provided between the digital values "10" and "01", and when the counter value shifts to "01" in the counter circuit, the output value of the voltage comparator circuit is inverted. The counter value "01" at this time is the value of the lower-order bits, whereby it is found that digital data D [(z−1):0]="1001".

The sub-ranging column-parallel A/D converter circuit includes, for an example, a column-parallel A/D converter circuit internally containing a difference detection circuit (refer to a patent document 2, for example), as shown in FIG. 13, which is provided with a conversion circuit 2000 having a sampling and holding circuit (hereinafter, simply referred to as the "S/H circuit" occasionally) 2001 to hold the conversion object analog voltage signal Vpix, a comparator 2002 to compare the conversion object analog voltage signal Vpix with the ramp voltage Yr (=upper-order bit converting ramp voltage Vrc), a difference detection circuit 2004 to output difference voltage value between the conversion object analog voltage signal Vpix and the ramp voltage Vrc, a S/H circuit 2005 to hold the voltage value outputted from the difference detection circuit 2004, a logic circuit 2003 having a function to control and make the S/H circuit 2005 hold the difference voltage value at the time of the output change of the comparator 2002, an attenuation circuit 2006 to generate the ramp voltage Vrf in which a voltage width of the ramp voltage Vrc is adjusted to 1/K, a comparator 2007 to compare the ramp voltage Vrf with the voltage held in the S/H circuit 2005, and a logic circuit 2008 to generate a signal Vcp_1' to define a timing for holding the value of the counter circuit corresponding to the value of the upper-order bits, based on the output signal of the comparator 2007.

In addition, in the case of the column-parallel A/D converter circuit disclosed in the patent document 2, when it is assumed that the bit number of the digital data is 10, the bit number of the upper-order bits is 5, and the bit number of the lower-order bits is 5, a time for $2^5=32$ clocks is required for the first conversion process, and a time for $2^5=32$ clocks is required for the second conversion process, so that a time for 64 (=32+32) clocks is required. Therefore, as described above, while column-parallel A/D converter circuit disclosed in the patent document 1 to convert the conversion object analog voltage signal to the digital data by the one-step conversion process needs the time for 1024 clocks, the sub-ranging column-parallel A/D converter circuit disclosed in the patent document 2 only needs the time for 64 clocks in the conversion process, so that the process time is considerably shortened.

As another sub-ranging column-parallel A/D converter circuit, there is a column-parallel A/D converter circuit using a capacity ratio (refer to a patent document 3, for example), as shown in FIG. 14, composed of a S/H circuit 3001 to hold the conversion object analog voltage signal Vpix, a comparator circuit 3005 to compare the conversion object analog voltage signal Vpix with a reference voltage, a switch circuit 3002 to input the ramp voltage Vrc to the comparator circuit 3005 at the time of the execution of the first conversion process to find the upper-order bits of the converted digital data, a capacitative element 3003 to input the ramp voltage Vrf to the comparator circuit 3005 as a reference voltage at the time of the execution of the second conversion process to find the unconverted bits after the first conversion process, a capacitative element 3004 and the capacitative element 3003 to hold the voltage value of the reference voltage at the time of the output change of the comparator circuit 3005 in the first conversion process, and a logic circuit 3006 to generate a control signal to hold the ramp voltage Vrc in the capacitative element 3004 at the time of the output change of the comparator circuit 3005 in the first conversion process.

According to the column-parallel A/D converter circuit disclosed in the patent document 3, in the first conversion process, the conversion object analog voltage signal Vpix is inputted to the comparator circuit 3005 through the S/H circuit 3001, and the switch circuit 3002 is turned on and the ramp voltage Vrc is inputted. In addition, a configuration of the ramp voltage Vrc is the same as that of the ramp voltage Vrc shown in FIGS. 8 and 9. When the output of the comparator circuit 3005 is inverted while the ramp voltage Vrc monotonously increases step-by-step, the switch circuit 3002 is turned off by the control signal from the logic circuit 3006, and the ramp voltage Vrc is held in the capacitative element 3004. At this time, the digital value of the counter circuit is stored in a memory circuit (not shown) as the value of the upper-order bits of the digital data. In the second conversion process, the ramp voltage Vrf monotonously decreasing step-by-step is inputted. When the output of the comparator circuit 3005 is inverted, the digital value of the counter circuit is stored in the memory circuit (not shown) as the value of the lower-order bits of the digital data. In addition, a configuration of the voltage Vrf is the same as that of the ramp voltage Vrf shown in FIGS. 8 and 9.

As shown in FIG. 14, since the column-parallel A/D converter circuit disclosed in the patent document 3 is composed of the one S/H circuit, the two capacitative elements, and the switch circuit, its circuit size can be small.

As still another sub-ranging column-parallel A/D converter circuit, there is a column-parallel A/D converter circuit internally containing an integration circuit (refer to a patent document 4, for example), as shown in FIG. 15, which is composed of an input circuit 4010 to receive the conversion object analog voltage signal Vpix and reference voltages VDE1 and VDE2, an integration circuit 4020 to integrate the reference voltage VDE 1 outputted from the input circuit 4010 at the time of a first conversion process, and the reference voltage VDE2 outputted from the input circuit 4010 at the time of a second conversion process, a comparator circuit 4030 to compare an output voltage of the integration circuit 4020 with a reference voltage Vref, and a logic circuit 4040 to generate a control signal used to hold the voltage level of the integration circuit 4020 at the time of output change of the comparator circuit 4030 in the first conversion process. In addition, FIG. 16 shows a variation of the column-parallel A/D converter circuit internally containing the integration circuit disclosed in the patent document 4, and its operation principle is the same as that of the column-parallel A/D converter circuit internally containing the integration circuit shown in FIG. 15.

According to the column-parallel A/D converter circuit disclosed in the patent document 4, the integration circuit 4020 integrates the reference voltage VDE1 (corresponding to the first change amount ΔV1 in the patent document 2 and the patent document 3) and the reference voltage VDE2 (corresponding to the second change amount ΔV2 in the patent document 2 and the patent document 3) to generate the voltage corresponding to the upper-order bits and the voltage corresponding to the lower-order bits to be compared with the conversion object analog voltage signal Vpix, without using the monotonously increasing ramp voltage Vrc and the monotonously decreasing ramp voltage Vrf unlike in the patent document 2 and the patent document 3.

According to the column-parallel A/D converter circuit disclosed in the patent document 4, before the execution of the first conversion process, the switch circuit 4012 is turned on and the switch circuit 4014 is turned off and then the conversion object analog voltage signal Vpix is inputted to the integration circuit 4020. In the first conversion process, the switch circuit 4012 is turned off and the switch circuit 4013 is connected to the side of the reference voltage VDE1 and then the switch circuit 4014 is turned on, and then the reference voltage VDE1 (corresponding to the first ramp voltage Vrc having a relatively large inclination) is integrated. When the output value of the comparator circuit 4030 is inverted, the digital value of the counter circuit (not shown) at this time is stored as the value of the upper-order bits, and the switch circuit 4014 is turned off by the control signal outputted from the logic circuit 4040. Thus, the difference voltage value Vdif is held in the integration circuit 4020. In the second conversion process, the switch circuit 4013 is connected to the side of the reference voltage VDE2 and then the switch circuit 4014 is turned on, and then the reference voltage VDE2 (corresponding to the second ramp voltage Vrf having an inclination smaller than that of the first ramp voltage Vrc) is integrated. When the output value of the comparator circuit 4030 is inverted, the digital value of the counter circuit (not shown) at this time is stored as the value of the lower-order bits, and the second conversion process is completed.

As described above, since the conversion object analog voltage signal is converted to the digital data by the two conversion processes in the sub-ranging column-parallel A/D converter circuit disclosed in the patent documents 2 to 4, the number of steps for the conversion process can be considerably reduced, so that the time required for the conversion process can be shortened.

Patent document 1 Japanese Unexamined Patent Publication No. 2000-286706
Patent document 2 Japanese Unexamined Patent Publication No. 1999-168383
Patent document 3 Japanese Unexamined Patent Publication No. 2002-232291
Patent document 4 Japanese Unexamined Patent Publication No. 2005-348325

DISCLOSURE OF THE INVENTION

Problems to be Solved by the Invention

However, according to the column-parallel A/D converter circuit disclosed in the patent document 2, the circuit size of the conversion circuit is large due to the two comparator circuits each having a relatively large circuit area. In addition, according to the column-parallel A/D converter circuit disclosed in the patent document 4, a circuit size of the conversion circuit is large due to the integration circuit having a relatively large circuit area. Especially, in the case of the column-parallel A/D converter circuit mounted on the solid-state imaging element, the number of pixels (number of solid-state imaging elements) considerably increases because the resolution of the solid-state imaging element becomes high recently, and accordingly the number of conversion circuits used in the solid-state imaging device considerably increases, and the circuit size problematically becomes large. Furthermore, recently, a unit area of the solid-state imaging element constituting the solid-state imaging device is minimized, and a pixel pitch is narrowed, so that the A/D converter circuit is required to minimize its circuit size so as to be arranged in conjunction with the small pixel pitch.

Meanwhile, according to the column-parallel A/D converter circuit disclosed in the patent document 3, since the one S/H circuit and the two capacitative elements having relatively small area are used, the circuit size of the conversion circuit can be small. However, according to the column-parallel A/D converter circuit disclosed in the patent document 3, when there is a variation in characteristics (capacity ratios) of the two capacitative elements, the problem is that it is highly likely that a variation is generated between the first ramp voltage Vrc inputted to the comparator 3005 without passing through the capacitative element and the second ramp voltage Vrf inputted to the comparator 3005 through the capacitative element. When the column-parallel A/D converter circuit is mounted on the solid-state imaging device, the variation between the first ramp voltage Vrc and the second ramp voltage Vrf becomes a noise, which could degrade image quality. More specifically, it appears as a variation between columns on vertical lines on an image taken by the solid-state imaging element. In addition, when the capacities of the two capacitative elements are increased to suppress the variation in capacity ratio with a view to preventing the image quality from degrading, the circuit size problematically increases.

In addition, according to the column-parallel A/D converter circuit disclosed in the patent document 2, when there is a variation in characteristics of the difference detection circuit and the attenuation circuit, the problem is that a variation is sometimes generated between the first ramp voltage Vrc used in the first conversion process to find the upper-order bits, and the second ramp voltage Vrf used in the second conversion process to find the lower-order bits. When the column-parallel A/D converter circuit is mounted on the solid-state imaging device, the variation between the first ramp voltage Vrc and the second ramp voltage Vrf becomes a noise, which could degrade image quality. More specifically, it appears as a variation between columns on vertical lines on an image taken by the solid-state imaging element.

In addition, according to the column-parallel A/D converter circuit disclosed in the patent document 4 shown in FIG. 15, since the conversion object analog voltage signal Vpix is directly inputted to an output node of the integration circuit 4020 through the S/H circuit 4011 and the switch circuit 4012, it is affected by variations of a resistor element 4021, an amplifier circuit 4022, and a capacitative element 4023 in the integration circuit 4020, and the problem is that its image quality could degrade. In addition, according to the column-parallel A/D converter circuit disclosed in the patent document 4 shown in FIG. 16, since the conversion object analog voltage signal Vpix is inputted to an input node of the integration circuit 5020 through the S/H circuit 5011 and the switch circuit 5013, variations of a resistor element 5021, an amplifier circuit 5022, and a capacitative element 5023 in the integration circuit 5020 can be effectively cancelled. However, in the case shown in FIG. 16, since a time to integrate the conversion object analog voltage signal Vpix in the integration circuit 5020 is newly needed, the problem is that its operation speed cannot be high enough.

Recently, the solid-state imaging device is required to improve the conversion process speed of the A/D converter circuit, to prevent image quality from degrading due to a characteristic variation (to prevent conversion accuracy from degrading), and to reduce a circuit size. However, as described above, both of prevention of degradation in conversion accuracy and prevention of increase in circuit size cannot be implemented by any one of the column-parallel A/D converter circuits disclosed in the patent document 2 to the patent document 4.

The present invention was made in view of the above problems, and it is an object of the present invention to provide a sub-ranging A/D converter circuit capable of effectively implementing both of the prevention of degradation in conversion accuracy due to the characteristic variation and prevention of increase in circuit size. Furthermore, it is an object of the present invention to provide a solid-state imaging device provided with a sub-ranging A/D converter circuit capable of effectively implementing both of the prevention of degradation in conversion accuracy due to the characteristic variation and prevention of increase in circuit size.

Means for Solving the Problem

As first characteristics, an A/D converter circuit according to the present invention in order to attain the above object comprises: a first capacitative element; a second capacitative element having an output end connected to an input end of the first capacitative element; a third capacitative element having an output end connected to an input end of the second capacitative element; a voltage comparator circuit having an input terminal connected to an output end of the first capacitative element, configured to compare a voltage value of the input terminal with a predetermined threshold voltage value; a first input circuit configured to input an externally inputted conversion object analog voltage signal to a first intermediate node provided between the first capacitative element and the second capacitative element; a second input circuit configured to input a first reference voltage to a second intermediate node provided between the second capacitative element and the third capacitative element, the first reference voltage being used for a first conversion process to find a value of sequential bits containing the most significant bit, in digital data provided after the conversion object analog voltage signal has been converted; a third input circuit configured to input a second reference voltage to an input end of the third cap acitative element, the second reference voltage being used for a second conversion process to find a value of unconverted bits in the digital data after the first conversion process; a control circuit configured to generate a control signal to hold a voltage value of the first reference voltage in the third capacitative element when an output of the voltage comparator circuit changes in the first conversion process; a first ramp voltage generator circuit configured to generate a first ramp voltage having a voltage value monotonously changing step-by-step, and output the first ramp voltage as the first reference voltage while at least the first conversion process is executed; a second ramp voltage generator circuit configured to generate a second ramp voltage having a voltage value monotonously changing step-by-step or sequentially, and output the second ramp voltage as the second reference voltage while at least the second conversion process is executed; a counter circuit configured to output a digital value counted in response to a change of the first ramp voltage and a change of the second ramp voltage; and a memory circuit configured to store the digital value when the output of the voltage comparator circuit changes.

As second characteristics, the A/D converter circuit according to the present invention is further configured in such a manner that the first input circuit includes a first switch circuit configured to set whether or not the conversion object analog voltage signal is inputted to the first intermediate node, and turns on the first switch circuit in a predetermined period before the counter circuit starts counting in the first conversion process, the second input circuit includes a second switch circuit configured to set whether or not the first reference voltage is inputted to the second intermediate node, and turns on the second switch circuit in the first conversion process, and the third input circuit includes a third switch circuit configured to set whether or not the second reference voltage is inputted to the third capacitative element, and turns off the third switch circuit in a period from when the output of the voltage comparator circuit changes to when the second conversion process starts, based on the control signal.

As third characteristics, the A/D converter circuit according to the present invention is further configured in such a manner that the first input circuit includes a first switch circuit configured to set whether or not the conversion object analog voltage signal is inputted to the first intermediate node, and turns on the first switch circuit in a predetermined period before the counter circuit starts counting in the first conversion process, the second input circuit includes a fourth switch circuit configured to divide the second intermediate node into a first divided node on the side of the second capacitative element and a second divided node on the side of the third capacitative element in order to control an electric connection between the second capacitative element and the third capacitative element, a second switch circuit configured to set whether or not the first reference voltage is inputted to the first divided node, and a fifth switch circuit configured to set whether or not a third reference voltage such as the first reference voltage or a voltage corresponding to the first reference voltage is inputted to the second divided node, and is configured to turn on the second switch circuit in the first conversion process, turn off the fourth switch circuit in the first conversion process, and turn on the fifth switch circuit in a period from when the counter circuit starts counting to when the output of the voltage comparator circuit changes in the first conversion process, based on the control signal, to hold the voltage value of the first reference voltage when the output of the voltage comparator circuit changes, in the third capacitative element, and the third input circuit is configured to directly input the second reference voltage to an input terminal of the third capacitative element.

As fourth characteristics, the A/D converter circuit according to the present invention is further configured in such a manner that the second ramp voltage generator circuit generates the second ramp voltage changing in an opposite direction to the change in the first ramp voltage in the first conversion process, in the second conversion process.

As fifth characteristics, the A/D converter circuit according to the present invention is further configured in such a manner that the voltage comparator circuit includes an inverter circuit, and a sixth switch circuit configured to cause short circuit between an input terminal and an output terminal of the inverter circuit, and short circuit is caused in the inverter circuit by the sixth switch circuit for initialization in a predetermined initialization period before the conversion object analog voltage signal is inputted to the first intermediate node by the first input circuit.

As sixth characteristics, the A/D converter circuit according to the present invention is further configured in such a manner that the control circuit controls an output timing of the control signal so as not to switch a switch circuit controlled by the control signal from when the first ramp voltage inputted to the third capacitative element changes to when a voltage value changing in response to a change in the first ramp voltage becomes stable at the input end and the output end of the third capacitative element, in the first conversion process.

As seventh characteristics, the A/D converter circuit according to the present invention is further configured in such a manner that the first ramp voltage monotonously changes step-by-step by a first change amount provided by dividing a voltage width of the conversion object analog voltage signal by a split number based on a first resolution previously set according to a bit number of the digital data, and the second ramp voltage monotonously changes step-by-step by a second change amount provided by dividing the first change amount by a split number based on a second resolution defined so that a sum of a value of a bit number corresponding to the second resolution and a value of a bit number corresponding to the first resolution is equal to a value of the bit number of the digital data.

As eighth characteristics, the A/D converter circuit according to the present invention is further configured in such a manner that the first ramp voltage monotonously changes step-by-step by a first change amount provided by dividing a voltage width of the conversion object analog voltage signal by a split number based on a first resolution previously set according to a bit number of the digital data provided after the conversion object analog voltage signal has been converted, and the second ramp voltage sequentially and monotonously changes.

As ninth characteristics, the A/D converter circuit according to the present invention is further configured in such a manner that the second ramp voltage generator circuit generates and outputs the second ramp voltage in a period including one or both of a period just before the second conversion process and a period just after the second conversion process, in addition to an execution period of the second conversion process.

A solid-state imaging device according to the present invention to attain the above object includes: a solid-state imaging element group composed of a plurality of solid-state imaging elements arranged in a matrix and configured to convert an optical signal to an electric signal; a first capacitative element, a second capacitative element, a third capacitative element, a voltage comparator circuit, a first input circuit, a second input circuit, a third input circuit, a control circuit, and memory circuits provided with respect to each column of the solid-state imaging element group; and a first ramp voltage generator circuit, a second ramp voltage generator circuit, and a counter circuit provided on the same chip with respect to the solid-state imaging element group, wherein the first capacitative element, the second capacitative element, the third capacitative element, the voltage comparator circuit, the first input circuit, the second input circuit, the third input circuit, the control circuit, the memory circuits, the first ramp voltage generator circuit, the second ramp voltage generator circuit, and the counter circuit constitute the A/D converter circuit having the above first to ninth characteristics.

Effect of the Invention

According to the above A/D converter circuit, since the sub-ranging A/D converter circuit is composed of the three capacitative elements having relatively small circuit areas, and the voltage comparator circuit serving as a logic circuit such as an inverter circuit having a relatively small area, increase in circuit area can be suppressed. In addition, the above A/D converter uses the first capacitative element, the second capacitative element, and the third capacitative element to hold the difference voltage, using the auto-zero technique to cancel the characteristic variation in inversion level of the voltage comparator circuit, so that the variation in absolute values of the capacity values of the first capacitative element, the second capacitative element, and the third capacitative element do not directly affect the A/D converted result. Therefore, the conversion accuracy can be effectively prevented from degrading due to the variation among the circuits. Since the degradation in conversion accuracy can be effectively prevented in the present invention, the noise in image quality is more effectively prevented from being generated in the taken image when the present invention is applied to a solid-state imaging device. That is, according to the above A/D converter circuit, both of the prevention of degradation in conversion accuracy and the prevention of increase in circuit size can be effectively implemented.

In addition, according to the A/D converter circuit having the fourth characteristics, since the second ramp voltage changing in the opposite direction to the change in the first ramp voltage is generated, the third capacitative element after the first conversion process can be directly used in the second conversion process, so that the A/D converter circuit according to the present invention can be implemented with the relatively simple circuit configuration.

According to the A/D converter circuit having the fifth characteristics, since the voltage comparator circuit is composed of the inverter circuit and the switch circuit each having a relatively small area, the voltage comparator circuit can be implemented with the simple configuration, and the increase in circuit size can be prevented.

According to the A/D converter circuit having the sixth characteristics, since the state of the switch circuit is controlled by the control signal so as not be changed from when the first ramp voltage changes to when the voltages at the input end and the output end of the third capacitative element becomes stable in the first conversion process, the voltage at the input end or the output end of the third capacitative element can be sufficiently settled down in the first conversion process, and the voltage can be held in the third capacitative element under the condition that the voltage value of the first ramp voltage is stable. Thus, the variation caused in the circuit can be effectively prevented. In addition, when the A/D converter circuit having the sixth characteristics is used in the solid-state imaging device, the image quality can be effectively prevented from degrading due to the noise.

According to the A/D converter circuit having the eighth characteristics, since the second ramp voltage is configured to sequentially and monotonously changes, in the case of the first process to hold the first ramp voltage in the third capacitative element at the time of the output change of the voltage comparator circuit, the first ramp voltage keeping the same voltage value stably in the given period is used, and in the case of the second conversion process in which the second ramp voltage is not held, the second ramp voltage superior in monotonous increasing property is used. Thus, the frequency of the counter circuit can be improved in the second conversion process, so that the bit resolution can be highly accurate by a relatively easy way.

According to the A/D converter circuit having the ninth characteristics, since the second ramp voltage generator circuit is configured to generate the second ramp voltage in the period including one or both of the given period just before the second conversion process and the given period just after the second conversion process, in addition to the execution period of the second conversion process, it can more effectively solve the problem that the offset voltage is generated in the difference voltage and the voltage comparator circuit cannot detect the difference voltage in the second process because the difference between the difference voltage of the conversion object analog voltage signal used in the second conversion process, and the first ramp voltage at the time of the output change of the voltage comparator circuit in the first conversion process is very small, or because the value of the difference voltage is roughly equal to the value of the first change amount.

According to the solid-state imaging device having the above characteristics, since it is provided with the A/D converter circuit having the first to tenth characteristics, the increase in circuit area of the A/D converter circuit can be prevented, the noise is effectively prevented from being generated due to the variation in characteristics of the transistor element and the capacitive element, and the conversion accuracy can be effectively prevented from degrading due to the generation of the noise, while using the sub-ranging A/D converter circuit capable of implementing a relatively high frame rate. Furthermore, according to the solid-state imaging device having the above characteristics, since the noise can be effectively prevented from being generated in the A/D converter circuit, degradation in the image quality of the taken image, such as noise generated in the form of a vertical line in the taken image, can be prevented more effectively.

EXPLANATION OF REFERENCES

Figure 1:
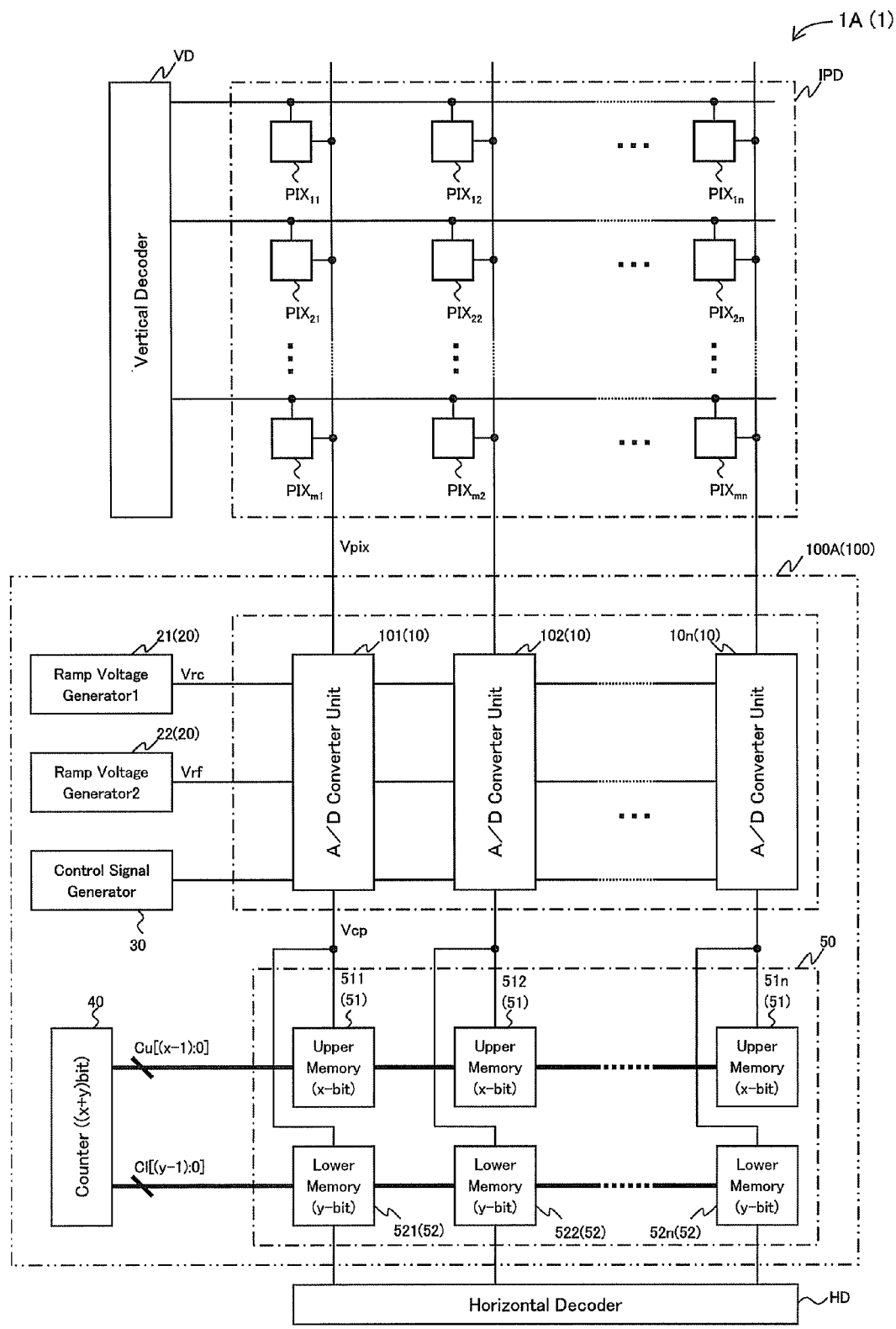
FIG. 1 is a schematic partial block diagram showing a schematic configuration example in a first embodiment of a solid-state imaging device according to the present invention.

1 Solid-state Imaging Device according to the present invention
1A Solid-state Imaging Device according to the present invention
1B Solid-state Imaging Device according to the present invention
10 A/D Converter Unit
12 Control Circuit
20 Ramp Voltage Generator Circuit
21 First Ramp Voltage Generator Circuit
22 Second Ramp Voltage Generator Circuit
23 First Ramp Voltage Generator Circuit
30 Control Signal Generator Circuit
40 Counter Circuit
50 Memory Circuit
51 Upper-order Bit Memory Region
52 Lower-order Bit Memory Region
60 A/D Converter Unit
62 Control Circuit
100 A/D Converter Circuit according to the present invention
200 A/D Converter Circuit according to the present invention
121 D Flip-Flop Circuit
122 Negative AND Circuit
123 Inverter Circuit
621 D Flip-Flop Circuit
622 Negative AND Circuit
IPD Solid-state Imaging Element Group
PIX Solid-state Imaging Element
HD Horizontal Decoder
VD Vertical Decoder
C1 First Capacitative Element
C2 Second Capacitative Element
C3 Third Capacitative Element
N1 First Intermediate Node
N2 Second Intermediate Node
N3 Third Intermediate Node
ND1 First Divided Node
ND2 Second Divided Node
CMP Voltage Comparator Circuit
SW1 First Switch Circuit
SW2 Second Switch Circuit
SW3 Third Switch Circuit
SW4 Fourth Switch Circuit
SW5 Fifth Switch Circuit
SW6 Sixth Switch Circuit

BEST MODE FOR CARRYING OUT THE INVENTION

Hereinafter, a description will be made of embodiments of an A/D converter circuit and a solid-state imaging device according to the present invention (hereinafter, referred to as the "circuit of the present invention" and the "device of the present invention" occasionally) with reference to the drawings.

First Embodiment

A first embodiment of the circuit of the present invention and the device of the present invention will be described with reference to FIGS. 1 to 3.

First, configurations of the circuit of the present invention and the device of the present invention will be described with reference to FIGS. 1 and 2. Here, FIG. 1 shows a schematic configuration example of a device 1A of the present invention, on which a circuit 100A of the present invention is mounted, and FIG. 2 shows a schematic configuration example of the circuit 100A of the present invention according to this embodiment.

In addition, the circuit 100A of the present invention is a sub-ranging A/D converter circuit to execute a two-step conversion process composed of a first conversion process to find a value of sequential partial bits containing the most significant bit, in digital data provided after a conversion object analog voltage signal Vpix has been converted, and a second conversion process to find a value of unconverted bits in the digital data after the first conversion process. In addition, according to this embodiment, in order to simplify the description, it is assumed that the digital data is composed of 4 bits ($=2^4$) provided after the conversion object analog voltage signal Vpix has been converted, and the upper-order 2 bits are converted in the first conversion process, and the lower-order 2 bits are converted in the second conversion process. While a method for dividing into the upper-order bits and the lower-order bits is not limited, it is preferable to set the number of upper-order bits and the number of lower-order bits in such a manner that their difference is minimal with a view to shortening a conversion process time.

As shown in FIG. 1, the device 1A of the present invention is composed of, on the same chip, a solid-state imaging element group IPD in which a plurality of solid-state imaging elements $PIX_{ij}$ (i=1 to m, j=1 to n) each to convert an optical signal to an analog voltage signal Vpix are arranged in the form of a matrix, a plurality of A/D converter units 10 each provided with respect to each column of the solid-state imaging element group IPD, a memory circuit 50 in which a memory is provided with respect to each column of the solid-state imaging element group IPD, and those provided with respect to the solid-state imaging element group IPD, such as a first ramp voltage generator circuit 21 to generate a first ramp voltage Vrc used in the first conversion process, a second ramp voltage generator circuit 22 to generate a second ramp voltage Vrf used in the second conversion process, a control signal generator circuit 30 to generate various clock signals and control signals used in the A/D converter unit 10, a counter circuit 40 to output a counted digital value in response to a voltage change of the first ramp voltage Vrc and a voltage change of the second ramp voltage Vrf, a vertical decoder VD to select a reading target row in a reading process, and a horizontal decoder HD to select a reading target column in the reading process.

Figure 2:
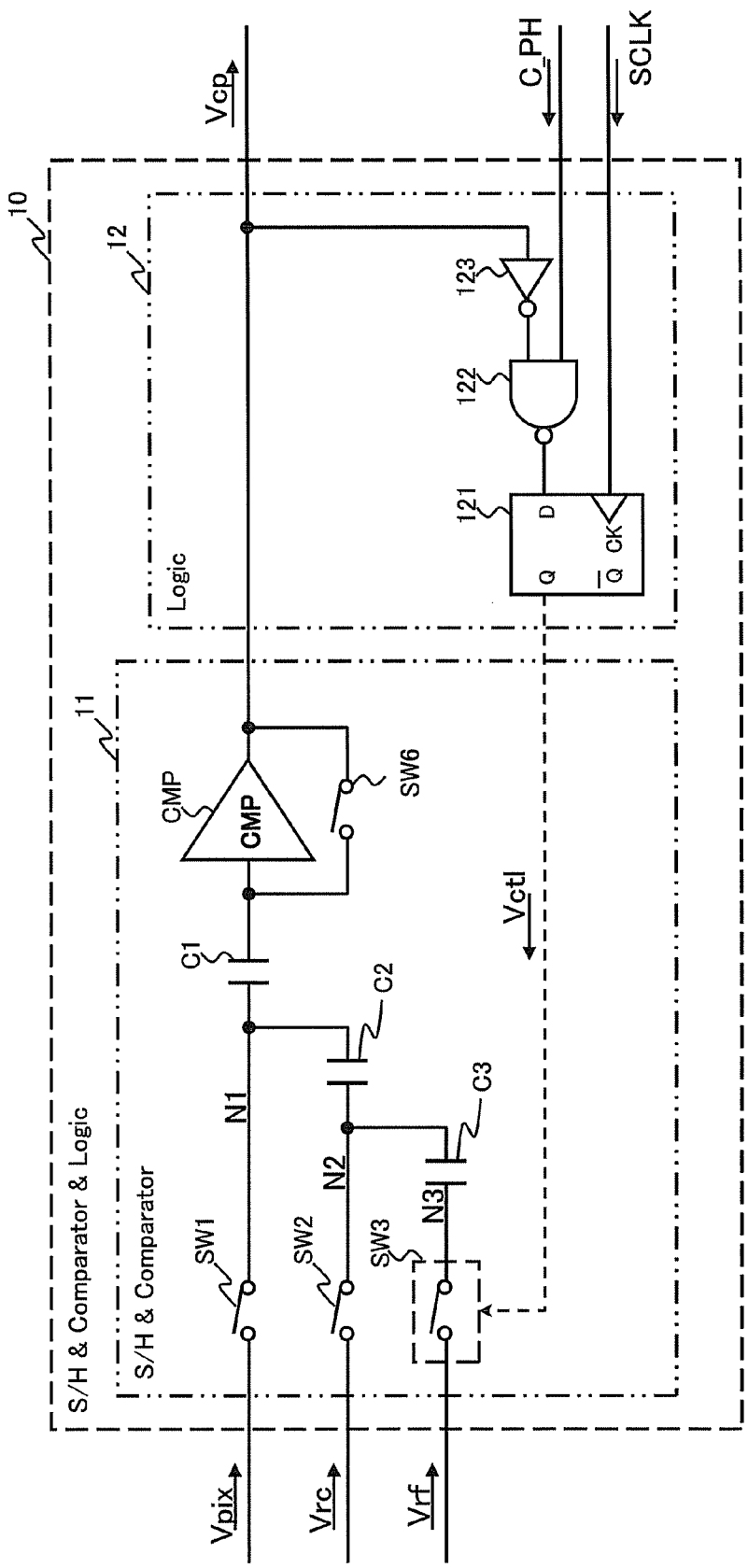
FIG. 2 is a schematic circuit diagram showing a schematic configuration example in the first embodiment of an A/D converter circuit according to the present invention.

More specifically, as shown in FIGS. 1 and 2, the circuit 100A of the present invention is composed of the A/D converter units 10, the memory circuit 50, the first ramp voltage generator circuit 21, the second ramp voltage generator circuit 22, the control signal generator circuit 30, and the counter circuit 40.

As shown in FIG. 2, the A/D converter unit 10 is composed of a first capacitative element C1, a second capacitative element C2 having an output end connected to an input end of the first capacitative element C1, a third capacitative element C3 having an output end connected to an input end of the second capacitative element C2, a voltage comparator circuit CMP having an input terminal connected to an output end of the first capacitative element C1 to compare a voltage value of the input terminal with a predetermined threshold voltage value Vth, a first input circuit to input the externally inputted conversion object analog voltage signal Vpix to a first intermediate node N1 between the first capacitative element C1 and the second capacitative element C2, a second input circuit to input the first reference voltage used for the first conversion process to a second intermediate node N2 between the second capacitative element C2 and the third capacitative element C3, a third input circuit to input the second reference voltage used for the second conversion process to an input end of the third capacitative element C3, and a control circuit 12 to generate a control signal Vctl to hold a voltage value of the first reference voltage in the third capacitative element C3 at the time of output change of the voltage comparator circuit CMP in the first conversion process.

More specifically, the first input circuit is provided with a switch circuit SW1 to set whether or not the conversion object analog voltage signal Vpix can be inputted to the first intermediate node N1, and it is configured to turn on the switch circuit SW1 during a given period before the counter circuit 40 starts counting in the first conversion process.

The second input circuit is provided with a switch circuit SW2 to set whether or not the first reference voltage can be inputted to the second intermediate node N2, and it is configured to turn on the switch circuit SW2 at the time of the first conversion process.

The third input circuit is provided with a switch circuit SW3 to set whether or not the second reference voltage can be inputted to the third capacitative element C3, and the switch circuit SW3 is connected to the input end of the third capacitative element C3 through the third intermediate node N3. The third input circuit is configured to keep the switch circuit SW3 in off state during a period from the output change of the voltage comparator circuit CMP to the start of the second conversion process, based on the control signal Vctl.

The voltage comparator circuit CMP is provided with an inverter circuit and a switch circuit SW6 to cause short circuit between an input terminal and an output terminal of the inverter circuit, and the switch circuit SW6 causes short circuit in the inverter circuit for initialization during a given initializing period before the conversion object analog voltage signal Vpix is inputted to the first intermediate node N1 by the first input circuit.

As shown in FIG. 2, the control circuit 12 is composed of a negative AND circuit 122 to calculate a negative AND between an inversion signal of an output signal Vcp of the voltage comparator circuit CMP outputted from a negative AND circuit 123, and an external input signal C_PH showing that the first conversion process is being executed, and a D flip-flop circuit (DFF circuit) 121 to latch and output an output signal from the negative AND circuit 122 when an externally inputted clock signal SCLK rises. In addition, according to this embodiment, as compared with a clock signal CLK used to generate the first ramp voltage Vrc by the first voltage generator circuit 21 to be described below, the clock signal SCLK has the same frequency but its phase is set to be shifted behind ¾ cycle in view of a settling time of voltages of the input end and the output end of the capacitative element C3. Thus, in the first conversion process, the switch circuit SW3 can be switched while the first ramp voltage Vrc is stable.

The first ramp voltage generator circuit 21 generates the first ramp voltage Vrc whose voltage value monotonously changes step-by-step in synchronization with the clock signal CLK, during at least an execution time of the first conversion process, and outputs it as the first reference voltage.

More specifically, the first ramp voltage Vrc is configured to monotonously change step-by-step by a first change amount ΔV1 provided by dividing a voltage width of the conversion object analog voltage signal Vpix by a split number based on a first resolution R1 which has been previously set based on the bit number of the digital data.

More specifically, since the upper-order 2 bits are converted in the first conversion process according to this embodiment, the first resolution R1 is set to 2 bits. In this case, the split number based on the first resolution R1 is such that $2^{R1}=2^2=4$, and the voltage value provided by dividing the voltage width of the conversion object analog voltage signal Vpix by 4 corresponds to the first change amount ΔV1 (that is, the first change amount ΔV1×4 is equal to the voltage width of the conversion object analog voltage signal Vpix).

Figure 3:
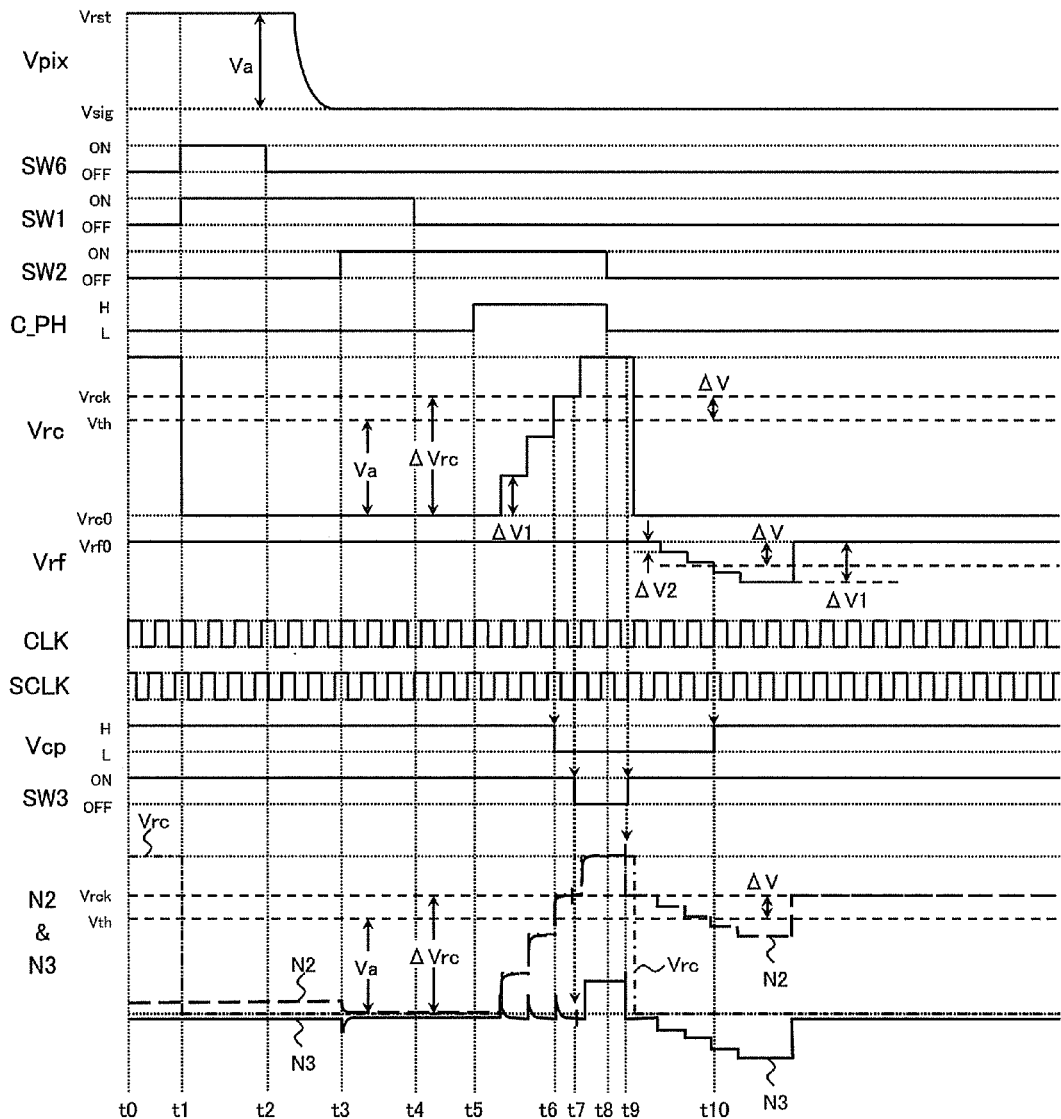
FIG. 3 is a schematic waveform diagram showing a waveform of each terminal in the first embodiment of the A/D converter circuit according to the present invention.

In addition, according to this embodiment, as will be shown in FIG. 3, since it is assumed that a voltage value of the conversion object analog voltage signal Vpix at the time of loading an image is lower than a reset level of the conversion object analog voltage signal Vpix, the description is made assuming that the first ramp voltage Vrc monotonously increases step-by-step, while it may monotonously decrease step-by-step depending on configurations of the conversion object analog voltage signal Vpix and another circuit.

The second ramp voltage generator circuit 22 generates the second ramp voltage Vrf whose voltage value monotonously changes step-by-step in synchronization with the clock signal CLK during at least an execution time of the second conversion process, and outputs it as the second reference voltage. More specifically, the second ramp voltage Vrf monotonously changes step-by-step by a second change amount ΔV2 provided by dividing the first change amount ΔV1 by split number based on a second resolution R2 which is defined in such a manner that a sum of the bit number corresponding to the second resolution R2 and the bit number corresponding to the first resolution R1 becomes the bit number of the digital data.

More specifically, the second resolution R2 is set such that the digital data bit number=the first resolution bit number R1+second resolution bit number R2. As described above, according to this embodiment, since the digital data bit number is set to 4, and the first resolution R1 is set to 2 bits, the second resolution R2 is 2 bits. Therefore, the split number based on the second resolution R2 is such that $2^{R2}=2^2=4$, and the second change amount ΔV2=the first change amount ΔV1/4.

In addition, according to this embodiment, the second ramp voltage Vrf in the second conversion process changes in the opposite direction to the change in the first ramp voltage Vrc in the first conversion process. That is, according to this embodiment, the second ramp voltage Vrf is configured to monotonously decrease step-by-step in the second conversion process as will be shown in FIG. 3. However, it may be configured to monotonously increase when the first ramp voltage Vrc is configured to monotonously decrease or depending on a circuit configuration.

The control signal generator circuit 30 generates various kinds of clock signals and control signals used in the A/D converter unit 10, such as the clock signal CLK, the clock signal SCLK, and the signal C_PH showing that the first conversion process is being executed as shown in FIG. 3. Furthermore, the control signal generator circuit 30 generates control signals to control the switching between on states and off states of the switch circuits SW6, SW3, and SW2.

The memory circuit 50 is composed of a upper-order bit memory region 51 and a lower-order bit memory region 52 with respect to each column of the solid-state imaging element group IPD, and when an output of the A/D converter unit 10 changes in the first conversion process, a digital value outputted from the counter circuit 40 is stored in the upper-order bit memory region 51, and when the output of the A/D converter unit 10 changes in the second conversion process, a digital value outputted from the counter circuit 40 is stored in the lower-order bit memory region 52.

More specifically, according to this embodiment, when an output level of the voltage comparator circuit CMP shifts from H level to L level, a digital value Cu outputted from the counter circuit 40 is stored in the upper-order bit memory region 51, and when the output level of the voltage comparator circuit CMP shifts from L level to H level, a digital value Cl outputted from the counter circuit 40 is stored in the lower-order bit memory region 52. In this configuration, when the counter values are stored in the upper-order bit memory region 51 and the lower-order bit memory region 52 of the memory circuit 50, the complicated control circuit 12 is not needed, so that the circuit configuration can be simple.

Next, a description will be made of operations of the circuit 100A of the present invention and the device 1A of the present invention, with reference to FIG. 3. Here, FIG. 3 shows signal waveforms and an internal state of the circuit 100A of the present invention according to this embodiment.

When an imaging process starts at a time t0, the device 1A of the present invention starts an initialization process to initialize each circuit in the circuit 100A of the present invention at a time t1. In the initialization process, a voltage Vrst of the solid-state imaging element $PIX_{ij}$ at a reset level is sampled.

More specifically, as shown in FIG. 3, at the time t1, the voltage value of the conversion object analog voltage signal Vpix outputted from the solid-state imaging element $PIX_{ij}$ is at the reset level Vrst, the voltage value of the first ramp voltage Vrc is at an initial level Vrc0, and the voltage value of the second ramp voltage Vrf is at an initial level Vrf0. In addition, the switch circuits SW1, SW2, and SW6 are in off state, and the switch circuit SW3 is in on state.

When the initialization process is started at the time t1, the switch circuit SW6 is turned on to cause short circuit between the input terminal and the output terminal of the voltage comparator circuit CMP, and a voltage of the voltage comparator circuit CMP at an inversion level Vth is inputted to the output end of the capacitative element C1. In addition, when the switch circuit SW1 is turned on at the time t1, the voltage signal at the reset level Vrst outputted from the solid-state imaging element PIX in the reading target row selected by the vertical decoder VD is inputted to the input end (first intermediate node N1) of the capacitative element C1.

In addition, as shown in FIG. 3, since the switch circuit SW3 is in on state, the voltage level of the third intermediate node N3 at this time is at the same voltage level as that of the second ramp voltage Vrf inputted through the switch circuit SW3, that is, the initial level Vrf0.

Then, at a time t2, when the switch circuit SW6 is turned off and short circuit of the voltage comparator circuit CMP is canceled, a difference voltage between the reset level Vrst and the inversion level Vth of the voltage comparator circuit CMP is held in the capacitative element C1, and the initialization process is completed. Then, by the imaging operation of the solid-state imaging element PIX, the conversion object analog voltage signal Vpix at a pixel level Vsig (voltage Vsig<voltage Vrst in the solid-state imaging element PIX according to this embodiment) is outputted from the solid-state imaging element PIX based on light intensity of an imaging target. Here, a difference voltage Va (absolute value of (Vsig−Vrst)) between the pixel level Vsig and the reset level Vrst of the conversion object analog voltage signal Vpix is the target of the first conversion process.

At a time t3, a sampling process to sample the signal level Vsig of the solid-state imaging element $PIX_{ij}$ is started in the image loading process.

More specifically, at the time t3, the switch circuit SW2 is turned on, while the switch circuit SW1 is kept in on state. Thus, the first ramp voltage Vrc at the initial level Vrc0 is inputted to the input end (second intermediate node N2) of the capacitative element C2, and the conversion object analog voltage signal Vpix at the pixel level Vsig is inputted to the output end (first intermediate node N1) of the capacitative element C2.

At a time t4, when the switch circuit SW1 is turned off, the difference voltage between the voltage value (initial level Vrc0) of the first ramp voltage Vrc and the voltage value (pixel level Vsig) of the conversion object analog voltage signal Vpix at the time t4 is held in the capacitative element C2, and the sampling process of the solid-state imaging element PIX at the signal level Vsig is completed.

At a time t5, the external input signal C_PH showing that the first conversion process is being executed becomes H level, and a sampling and holding process is started to hold the voltage used in the first conversion process to find the upper-order bit value and the second conversion process. In the first conversion process, the first ramp voltage generator circuit 21 generates the first ramp voltage Vrc which monotonously increases step-by-step by the first change amount ΔV1, in synchronization with the clock signal CLK of the device 1A of the present invention. The counter circuit 40 counts up from 0 by 1 in synchronization with the clock signal CLK in response to the increase of the ramp voltage, and outputs the digital value Cu [(x−1):0] (x represents the bit number of upper-order bits, or 2 in this embodiment). In addition, a voltage level Vrck (k=Cu) of the first ramp voltage Vrc is provided by adding the first change amount ΔV1×counter value Cu to the initial level Vrc0 (Vrc0+ΔV1×Cu).

In addition, at this time, as shown in FIG. 2, the second intermediate node N2 is at the initial level Vrc0 of the first ramp voltage Vrc. In addition, since the switch circuit SW2 is in on state at the time t5, the first ramp voltage Vrc is directly inputted to the second intermediate node N2 after the time t5, so that as shown in FIG. 3, the voltage level of the second intermediate node N2 rises every time the first ramp voltage Vrc rises. In addition, as shown in FIG. 2, since a voltage waveform of the second intermediate node N2 is gentle due to an on resistance of the switch circuit SW2 as compared with a voltage waveform of the first ramp voltage Vrc, the on resistance of the switch circuit SW2 is to be designed in view of a settling time of the voltage of the second intermediate node N2.

In addition, as shown in FIG. 2, the third intermediate node N3 is configured such that the first ramp voltage Vrc is inputted thereto through the third capacitative element C3 and the switch circuit SW2, and as shown in FIG. 3, the voltage level thereof rises instantaneously every time the first ramp voltage Vrc rises due to capacitive coupling of the third capacitative element C3. After that, the voltage level of the third intermediate node N3 returns to the original voltage level Vrf0, according to the on resistance of the switch circuit SW3 and a RC time constant of the third capacitative element C3. In addition, the capacity of the third capacitative element C3 is set based on a random variation due to kT/C noise (k: Boltzmann constant, T: absolute temperature, C: capacity value) as a thermal noise, a resolution (image quality accuracy) required for the circuit 100A of the present invention, and the voltage width (full-range, first change amount ΔV1×4) of the conversion object analog voltage signal Vpix. Furthermore, the on resistance of the switch circuit SW3 is to be designed in view of the capacity of the third capacitative element C3, and the settling time of the voltage level of the third intermediate node N3 from its instantaneous rise to the original voltage level Vrf0.

At a time t6, when the voltage level Vrck (k=Cu) of the first ramp voltage Vrc becomes higher than the value provided by adding the difference voltage Va to the initial voltage level Vrc0 of the first ramp voltage Vrc, that is, when the voltage level of the output end of the capacitative element C1 becomes higher than the inversion level Vth of the voltage comparator circuit CMP, the output level of the output signal Vcp of the voltage comparator circuit CMP is inverted from H level to L level. The counter value Cu at this time is a conversion result of the upper-order bits, and stored in the upper-order bit memory region 51. In addition, while only one A/D converter unit 10 is shown in FIG. 3, the time it takes for the level of the output signal Vcp of the voltage comparator circuit CMP to be inverted differs according to the solid-state imaging element PIX.

Here, in the following formulas 4 and 5, an input voltage Vin of the voltage comparator circuit CMP in the circuit 100A of the present invention in the first conversion process is shown with the threshold voltage value Vth of the voltage comparator circuit CMP, the initial level Vrst of the solid-state imaging element $PIX_{ij}$, the pixel level Vsig of the solid-state imaging element $PIX_{ij}$ at the time of imaging operation, and the initial level Vrc0 of the first ramp voltage Vrc.

$$Vin=Vrc+(Vsig-Vrc0)+(Vth-Vrst) \quad (4)$$

$$Vin-Vth=Vrc-\{Vrc0+(Vrst-Vsig)\} \quad (5)$$

Therefore, the first ramp voltage Vrc at the time of the output change of the voltage comparator circuit CMP in the first conversion process is represented by the following formula 6, based on the formulas 4 and 5 and FIG. 3. In addition, the first ramp voltage Vrc shown in the formula 6 includes not only the voltage level in a normal period but also the instantaneous voltage level at the time of rising.

$$Vrc=Vrc0+(Vrst-Vsig)=Vrc0+Va$$

$$\text{(provided that } Vin-Vth=0) \quad (6)$$

When the output level of the output signal Vcp of the voltage comparator circuit CMP is inverted, the control circuit 12 outputs the control signal Vctl to turn off the switch circuit SW3 at the time of rising (at a time t7) of the clock signal SCLK outputted from the control signal generator circuit 30. More specifically, before the output level of the output signal Vcp of the voltage comparator circuit CMP is inverted, the output signal Vcp of the voltage comparator circuit CMP is at H level and the external input signal C_PH is at H level, so that the output signal of the negative AND circuit 122 is at H level. When the output level of the output signal Vcp of the voltage comparator circuit CMP is inverted, the output signal of the voltage comparator circuit CMP becomes L level, so that the output signal of the negative AND circuit 122 becomes L level. Thus, at the time t7, the control signal Vctl to switch the switch circuit SW3 from on state to off state is outputted from the DFF circuit 121 at the time of rising of the clock signal SCLK. In addition, as for the clock signal SCLK, in order to prevent the switch circuit SW3 from being switched at the time of the voltage change of the first ramp voltage Vrc, its phase is set to be different from that of the clock signal CLK of the first ramp voltage generator circuit 21, that is, it is shifted behind ¾ cycle here, in view of the settling time of the voltages at the input end and output end of the capacitative element C3. Thus, the switch circuit SW3 can be switched while the first ramp voltage Vrc is stable.

Here, as shown in FIG. 3, at the time t6, the initial level Vrf0 of the second ramp voltage Vrf is inputted to the input end of the capacitative element C3, and the voltage level Vrck of the first voltage Vrc is inputted to the output end of the capacitative element C3. At the time t7, when the switch circuit SW3 is turned off, the difference voltage Vrck-Vrf0 between the voltage level Vrck of the first ramp voltage Vrc and the initial level Vrf0 of the second ramp voltage Vrf is held in the capacitative element C3.

At a time t8, when the external input signal C_PH showing that the first conversion process is being executed becomes L level, the switch circuit SW2 to set whether or not the first ramp voltage Vrc can be inputted is turned off, and the first conversion process is completed. In addition, when the external input signal C_PH shifts to L level at the time t8, the output level of the negative AND circuit 122 shifts from L level to H level in the control circuit 12, and the control signal Vctl to switch the switch circuit SW3 from off state to on state is outputted from the DFF circuit 121 at the time of rising of the next clock signal SCLK (at a time t9).

At the time t9, when the switch circuit SW3 is turned on in synchronization with the rising of the clock signal SCLK, the second conversion process is started. In the second conversion process, the second ramp voltage generator circuit 22 generates the second ramp voltage Vrf which monotonously decreases step-by-step by the second change amount ΔV2, in synchronization with the clock signal CLK of the device 1A of the present invention. The counter circuit 40 counts down from a maximum value of the lower-order bits by one in synchronization with the clock signal CLK, and outputs a digital value Cl [(y−1):0] (y represents the bit number of lower-order bits, or 2 in this embodiment) as a calculation result. Here, according to this embodiment, the lower-order bits are set to 2 bits, and ranges from 0 through 3, so that the maximum value of the lower-order bits is 3. In addition, a voltage level Vrfh (h=Cl) of the second ramp voltage Vrf is a value of Vrf0-ΔV2×C1 calculated by subtracting the second change amount ΔV2×counter value Cl from the initial level Vrf0.

In addition, at the time t9, when the switch circuit SW3 is turned on, the third intermediate node N3 is configured such that the second ramp voltage Vrf is inputted through the switch circuit SW3 thereto as shown in FIG. 2. Therefore, the voltage level of the third intermediate node N3 at this time is at the initial level Vrf0 of the second ramp voltage Vrf. After the time t9, while the switch circuit SW3 is in the on sate, the voltage level of the third intermediate node N3 is at the same level as that of the second ramp voltage Vrf.

In addition, at the time t9, when the switch circuit SW3 is turned on, the voltage level of the second intermediate node N2 settles down to the voltage level Vrck as shown in FIG. 3 because the voltage difference between it and the third intermediate node (Vrf0) is held. When the second conversion process is started, and the second ramp voltage Vrf which monotonously decreases step-by-step is inputted through the switch circuit SW3, the voltage level of the second intermediate node N2 monotonously decreases by the second change amount ΔV2 similar to the second ramp voltage Vrf.

At a time t10, the voltage level of the signal inputted to the voltage comparator circuit CMP becomes smaller than the threshold voltage value Vth, and the output of the voltage comparator circuit CMP shifts from L level to H level. The counter value Cl [(y−1):0] (y represents the number of lower-order bits, or 2 in this embodiment) at this time is a conversion result of the lower-order bits, and stored in the lower-order bit memory region 52. In addition, similar to the first conversion process, the time it takes for the level of the output signal Vcp of the voltage comparator circuit CMP to be inverted differs according to the solid-state imaging element PIX in the second conversion process.

Here, in the following formulas 7 and 8, the input voltage Vin of the voltage comparator circuit CMP in the second conversion process in the circuit 100A of the present invention is shown with the threshold voltage value Vth of the voltage comparator circuit CMP, the initial level Vrst of the solid-state imaging element PIX$_{ij}$, the pixel level Vsig of the solid-state imaging element PIX$_{ij}$ at the time of imaging operation, the initial level Vrf0 of the second ramp voltage Vrf, and the initial level Vrc0 of the first ramp voltage Vrc. In addition, the voltage level Vrck is the voltage level of the first ramp voltage Vrc in a normal period after the output change of the voltage comparator circuit CMP in the first conversion process.

$$Vin=Vrf+(Vrck-Vrf0)+(Vsig-Vrc0)+(Vth-Vrst) \quad (7)$$

$$Vin-Vth$$

$$=Vrf-\{Vrf0+(Vrst-Vsig)-(Vrck-Vrc0)\}$$

$$=Vrf-\{Vrf0-\Delta V\}$$

$$(\Delta V=(Vrst-Vsig)-(Vrck-Vrc0)=Va-\Delta Vrc) \quad (8)$$

Therefore, the second ramp voltage Vrf at the time of the output change of the voltage comparator circuit CMP in the second conversion process, that is, when Vin−Vth=0 is represented by the following formula 9, based on the formulas 7 and 8 and FIG. 3. In addition, the voltage level Vrf includes not only the voltage level of the second ramp voltage Vrf in a normal period but also the instantaneous voltage level at the time of rising.

$$Vrf=Vrf0-\Delta V$$

(provided that Vin−Vth) (9)

Second Embodiment

A description will be made of a second embodiment of a circuit of the present invention and a device of the present invention, with reference to FIGS. 4 to 6. In addition, according this embodiment, a description will be made of a case where configurations of the A/D converter unit and the first ramp voltage generator circuit are different from those in the first embodiment.

First, a description will be made of configurations of the circuit of the present invention and the device of the present invention with reference to FIGS. 4 and 5. Here, FIG. 4 shows a schematic configuration example of a device 1B of the present invention, on which a circuit 100B of the present invention is mounted, and FIG. 5 shows a schematic configuration example of the circuit 100B of the present invention according to this embodiment.

Figure 4:
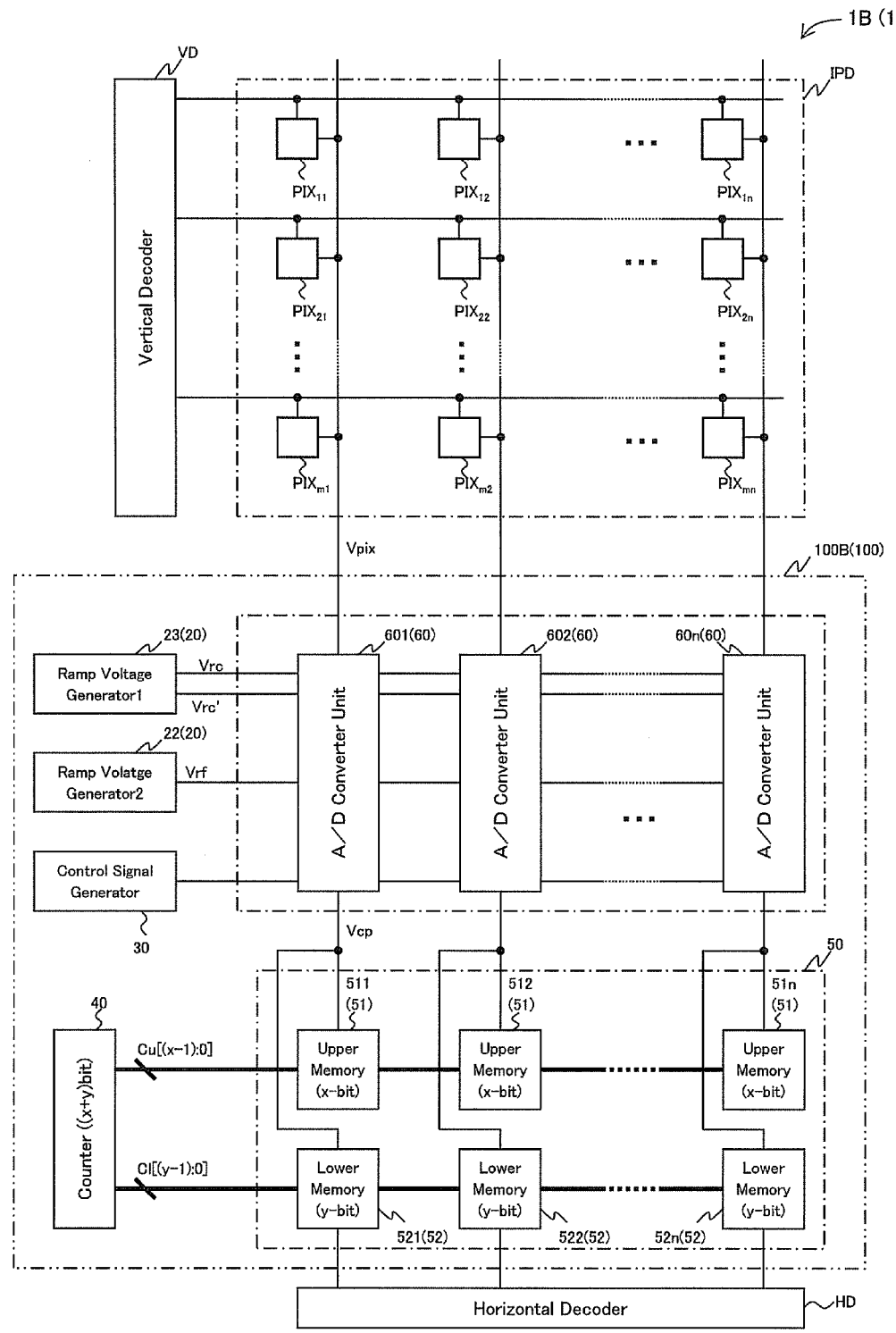
FIG. 4 is a schematic partial block diagram showing a schematic configuration example in the first embodiment of a solid-state imaging device according to the present invention.

As shown in FIG. 4, similar to the first embodiment, the device 1B of the present invention is composed of, on the same chip, a solid-state imaging element group IPD in which a plurality of solid-state imaging elements PIX$_{ij}$ (i=1 to m, j=1 to n) are arranged in the form of a matrix, a plurality of A/D converter units 60 each provided with respect to each column of the solid-state imaging element group IPD, a memory circuit 50, and those provided with respect to the solid-state imaging element group IPD, such as a first ramp voltage generator circuit 23, a second ramp voltage generator circuit 22, a control signal generator circuit 30, a counter circuit 40, a vertical decoder VD, and a horizontal decoder HD. In addition, configurations of the solid-state imaging element group IPD, the memory circuit 50, the second ramp voltage generator circuit 22, the control signal generator circuit 30, the counter circuit 40, the vertical decoder VD, and the horizontal decoder HD are the same as those in the first embodiment.

Figure 5:
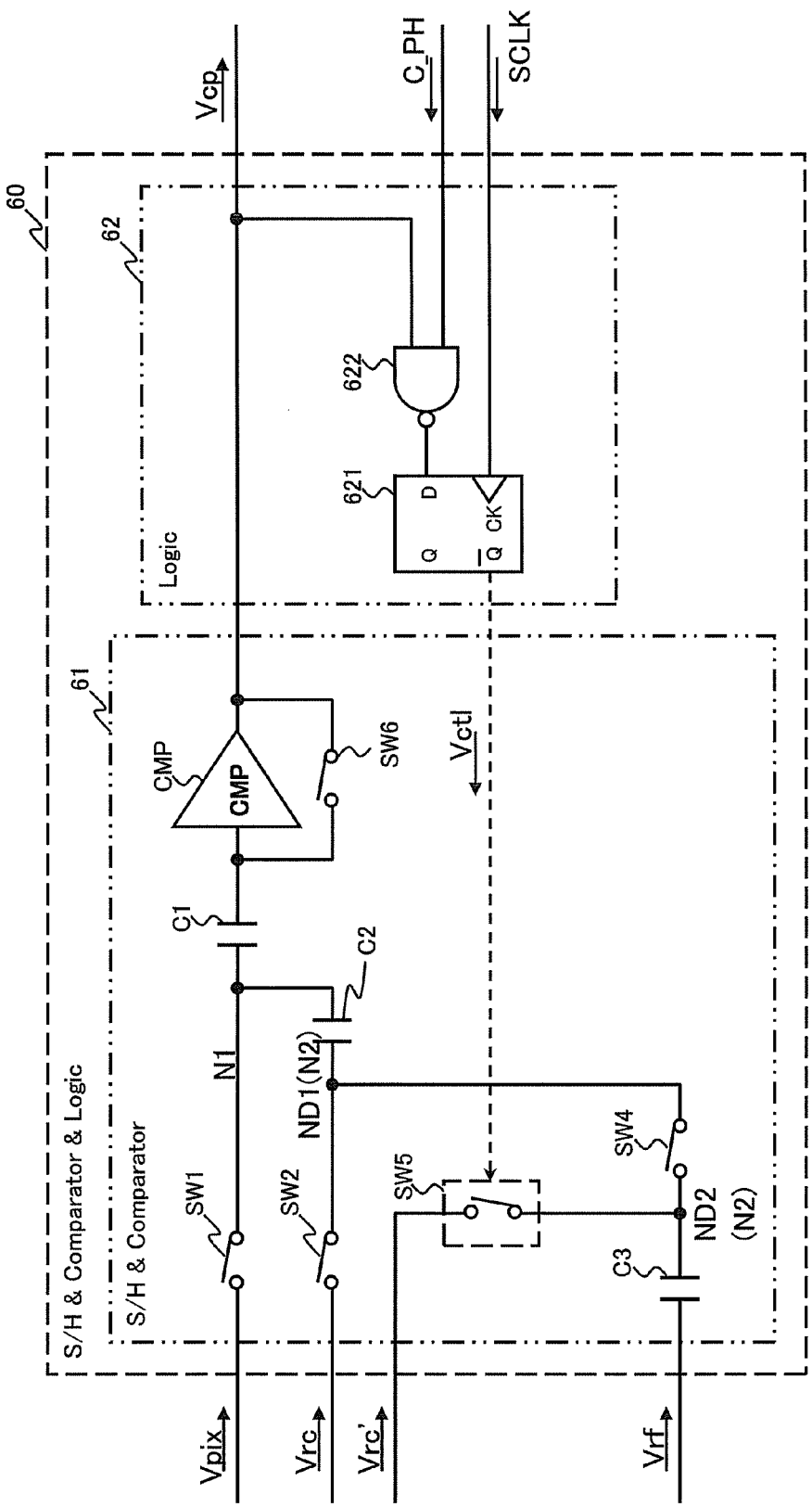
FIG. 5 is a schematic circuit diagram showing a schematic configuration example in a second embodiment of an A/D converter circuit according to the present invention.

The circuit 100B of the present invention according to this embodiment is a sub-ranging A/D converter circuit to execute a two-step conversion process composed of a first conversion process to find a value of upper-order bits and a second conversion process to find a value of lower-order bits, and similar to the first embodiment, as shown in FIGS. 4 and 5, it is composed of the A/D converter unit 60, the memory circuit 50, the first ramp voltage generator circuit 23, the second ramp voltage generator circuit 22, the control signal generator circuit 30, and the counter circuit 40.

As shown in FIG. 5, the A/D converter unit 60 is composed of a first capacitative element C1, a second capacitative element C2 having an output end connected to an input end of the first capacitative element C1, a third capacitative element C3 having an output end connected to an input end of the second capacitative element C2, a voltage comparator circuit CMP having an input terminal connected to an output end of the first capacitative element C1 to compare a voltage value of an input terminal with a predetermined threshold voltage value Vth, a first input circuit to input an externally inputted conversion object analog voltage signal Vpix to a first intermediate node N1 between the first capacitative element C1 and the second capacitative element C2, a second input circuit to input a first reference voltage used for the first conversion process to a second intermediate node N2 between the second capacitative element C2 and the third capacitative element C3, a third input circuit to input a second reference voltage used for the second conversion process to an input end of the third capacitative element C3, and a control circuit 62 to generate a control signal Vctl to hold a voltage value of the first reference voltage in the third capacitative element C3 at the time of output change of the voltage comparator circuit CMP in the first conversion process. In addition, configurations of the first capacitative element C1, the second capacitative element C2, the third capacitative element C3, the voltage comparator circuit CMP, and the first input circuit in this embodiment are the same as those in the first embodiment.

The second input circuit according to this embodiment is composed of a switch circuit SW4 to divide the second intermediate node N2 into a first divided node ND1 on the side of the second capacitative element C2 and a second divided node ND2 on the side of the third capacitative element C3, in order to control an electric connection between the second capacitative element C2 and the third capacitative element C3, a switch circuit SW2 to set whether or not a first reference voltage can be inputted to the first divided node ND1, and a switch circuit SW5 to set whether or not a third reference voltage such as the first reference voltage or a voltage corresponding to the first reference voltage can be inputted to the second divided node ND 2.

In addition, the second input circuit according to this embodiment is configured to turn on the switch circuit SW2 in the first conversion process, turn off the switch circuit SW4 in the first conversion process, and keep the switch circuit SW5 in on state from the time when the counter circuit 40 starts counting in the first conversion process to the output change of the voltage comparator circuit CMP, based on the control signal Vctl to hold the voltage value of the first reference voltage value at the time of output change of the voltage comparator circuit CMP, in the third capacitative element C3.

In addition, according to the first embodiment, while the third capacitative element C3 is electrically connected to the circuit to execute the first conversion process when the voltage value of the conversion target of the second conversion process to find the lower-order bits is held in the third capacitative element C3, according to this embodiment, the second input circuit is provided with the switch circuit SW4 and the switch circuit SW5, and the third capacitative element C3 is separated from the circuit to execute the first conversion process when the voltage value of the conversion target of the second conversion process to find the lower-order bits is held in the third capacitative element C3. Therefore, according to this embodiment, since the third capacitative element C3 is separated from the other circuit in the first conversion process, a glitch noise which is generated when the switch circuit SW5 is turned off does not spread to the other circuit, so that an image quality of a taken image of the device 1B of the present invention is effectively prevented from degrading.

The third input circuit according to this embodiment is configured in such a manner that the second reference voltage is directly connected to the input terminal of the third capacitative element C3.

As shown in FIG. 5, the control circuit 62 according to this embodiment is composed of a negative AND circuit 622 to calculate a negative AND between an output signal Vcp of the voltage comparator circuit CMP, and an external input signal C_PH showing that the first conversion process is being executed, and a D flip-flop circuit (DFF circuit) 621 to latch and output an output signal from the negative AND circuit 622 when an externally inputted clock signal SCLK rises. In addition, similar to the first embodiment, as compared with a clock signal CLK used to generate the third reference voltage Vrc' in the first voltage generator circuit 23 to be described below, the clock signal SCLK has the same frequency but its phase is set to be shifted behind ¾ cycle in view of a settling time of voltages of the input end and the output end of the capacitative element C3. Thus, the switch circuit SW5 can be switched in the first conversion process while the third ramp voltage Vrc' is stable.

According to this embodiment, the first ramp voltage generator circuit 23 outputs a first ramp voltage Vrc and the same voltage as the first ramp voltage Vrc as the third reference voltage Vrc' in synchronization with the clock signal CLK.

Next, a description will be made of operations of the circuit 100B of the present invention and the device 1B of the present invention with reference to FIG. 6. Here, FIG. 6 shows signal waveforms and internal state in the circuit 100B of the present invention according to this embodiment.

According to this embodiment, in an initial state, a voltage value of the conversion object analog voltage signal Vpix is at a reset level Vrst, a voltage value of the first ramp voltage Vrc is at an initial level Vrc0, and a voltage value of a second ramp voltage Vrf is at an initial level Vrf0. In addition, the switch circuits SW1, SW2, SW4, SW5, and SW6 are in off state.

In addition, configurations of the signal waveforms of the conversion object analog voltage signal Vpix, the clock signal CLK, the clock signal SCLK, the signal C_PH, the first ramp voltage Vrc, and the second ramp voltage Vrf are the same as those of the first embodiment. In addition, operations of the switch circuit SW1, the switch circuit SW2, and the switch circuit SW6 are the same as those in the first embodiment. Therefore, the operations of the circuit 100B of the present invention until the first conversion process is started at a time t5 are the same as those in the first embodiment, and at the time t5, the capacitative element C1 holds a difference voltage between the reset level Vrst of the solid-state imaging element PIX as the reading target and the inversion level Vth of the voltage comparator circuit CMP, and the capacitative element C2 holds a difference voltage between the initial level Vrc0 of the first ramp voltage Vrc, and a pixel level Vsig of the conversion object analog voltage signal Vpix.

At the time t5, when the external input signal C_PH showing that the first conversion process is being executed becomes H level, a sampling and holding process is started to hold the voltage used in the first conversion process to find a value of the upper-order bits and the second conversion process. According to this embodiment, similar to the first embodiment, in the first conversion process, the first ramp voltage generator circuit 23 generates the first ramp voltage Vrc which monotonously increases step-by-step by a first change amount $\Delta V1$ in synchronization with the clock signal CLK. In addition, similar to the first embodiment, the counter circuit 40 counts up from 0 by 1 in synchronization with the clock signal CLK, in response to the increase of the ramp voltage, and outputs a digital value Cu [(x−1):0] (x represents the bit number of upper-order bits, or 2 in this embodiment) as a calculation result.

Figure 6:
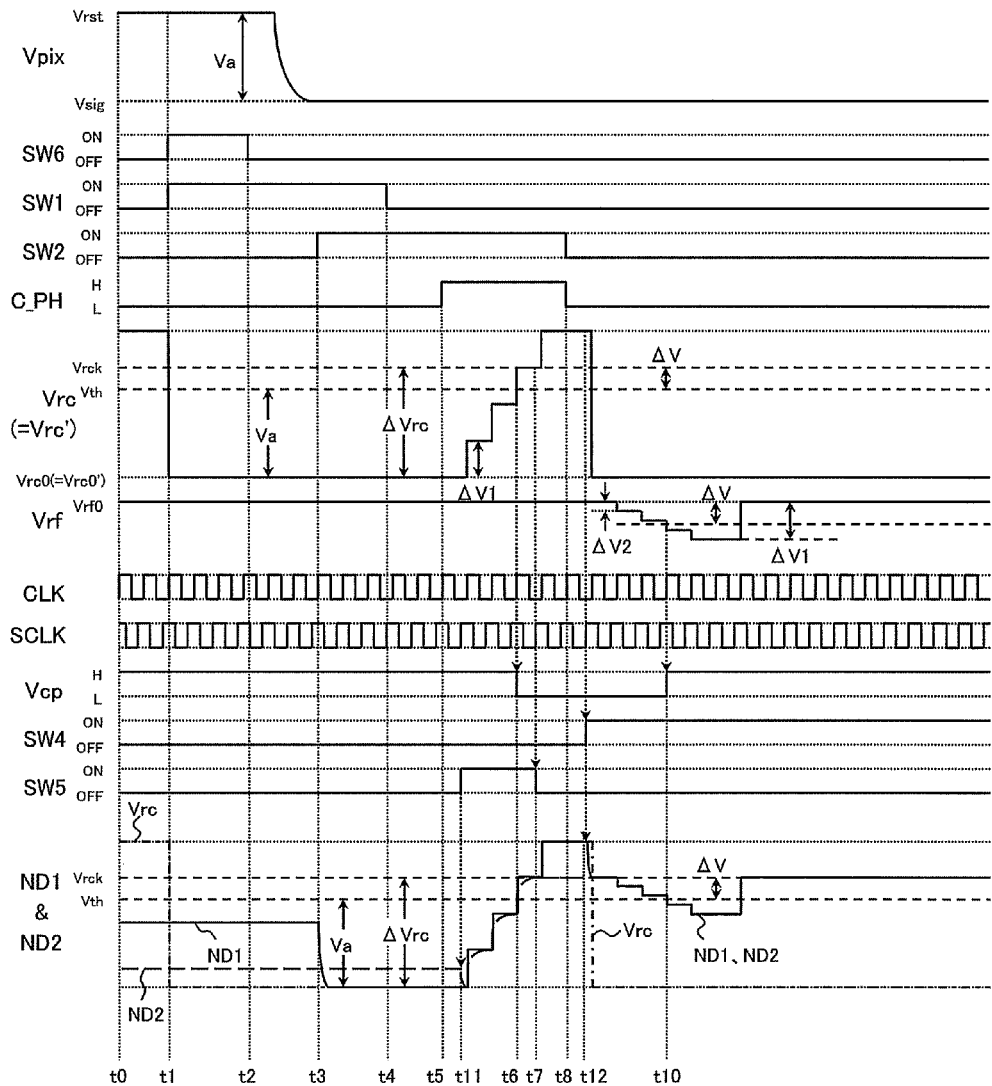
FIG. 6 is a schematic waveform diagram showing a waveform of each terminal in the second embodiment of the A/D converter circuit according to the present invention.

As shown in FIG. 6, at the time t5, when the external input signal C_PH becomes H level, the output signal Vcp of the voltage comparator circuit CMP inputted to the negative AND circuit 622 and the external input signal C_PH both become H level in the control circuit 62, and the output level of the negative AND circuit 622 shifts from H level to L level. As a result, the output level of the control signal Vctl outputted from the DFF circuit 621 of the control circuit 62 is switched at the time of rising (time t11) of the next clock signal SCLK, and the switch circuit SW5 is turned on.

Here, since the switch circuit SW5 is turned on and the switch circuit SW4 is turned off, in the first conversion process according to this embodiment, under the condition that the second capacitative element C2 and the third capacitative element C3 are electrically separated from each other, the first reference voltage Vrc is inputted to the second capacitative element C2, the third reference voltage Vrc' is inputted to the output end of the third capacitative element C3, and the second reference voltage Vrf is inputted to the input end thereof. As a result, the operation regarding the first conversion process, and the operation regarding the sampling and holding process to hold the voltage used in the second conversion process are prevented from being affected by each other.

In addition, when the switch circuit SW5 is turned on at a time t11, as shown in FIG. 6, a voltage level of the second divided node ND2 becomes an initial level Vrc0' of the third reference voltage Vrc'. Then, the voltage level of the second divided node ND2 rises every time the third reference voltage Vrc' rises. In addition, as shown in FIG. 6, since the voltage waveform of the second divided node ND2 is gentle as compared with the voltage waveform of the first ramp voltage Vrc due to the on resistance of the switch circuit SW5 and the capacity value of the capacitative element C3, the on resistance of the switch circuit SW5 and the capacity value of the capacitative element C3 are to be designed in view of the settling time of the voltage of the second divided node ND2.

In addition, at the time t5, the first divided node ND1 is at the initial level Vrc0 of the first ramp voltage Vrc because the first ramp voltage Vrc is inputted thereto through the switch circuit SW2. In addition, since the switch circuit SW2 is kept in on state in the first conversion process, the voltage level of the first divided node ND1 also rises every time the first ramp voltage Vrc rises. In addition, as shown in FIG. 6, since the voltage waveform of the first divided node ND1 is gentle as compared with the voltage waveform of the first ramp voltage Vrc due to the on resistance of the switch circuit SW2, the on resistance of the switch circuit SW2 is to be designed in view of the settling time of the voltage of the first divided node ND1. Since the first divided node ND1 (input end of the second capacitative element C2) and the second divided node ND2 (output end of the third capacitative element C3) are electrically separated from each other by the switch circuit SW4 in the first conversion process, the first divided node ND1 and the second divided node ND2 are prevented from being affected by each other.

At a time t6, when a voltage level Vrck of the first ramp voltage Vrc, that is, the voltage level of the output end of the capacitative element C1 becomes higher than the inversion level Vth of the voltage comparator circuit CMP, the output level of the output signal Vcp of the voltage comparator circuit CMP is inverted from H level to L level. A counter value Cu at this time is a conversion result of the upper-order bits, and it is stored in the upper-order bit memory region 51. In addition, while one A/D converter unit 60 is shown in FIG. 6, the time it takes for the level of the output signal Vcp of the voltage comparator circuit CMP to be inverted differs according to the solid-state imaging element PIX.

When the output level of the output signal Vcp of the voltage comparator circuit CMP is inverted to L level, the output level of negative AND circuit 622 becomes H level in the control circuit 62, and the DFF circuit 621 outputs the control signal Vctl to turn off the switch circuit SW5 at the time of rising of the next clock signal SCLK (time t7). Here, at the time t6, as shown in FIG. 6, the initial level Vrf0 of the second ramp voltage Vrf is inputted to the input end of the capacitative element C3, and the voltage level Vrck of the third reference voltage Vrc' is inputted to the output end of the capacitative element C3. When the switch circuit SW5 is turned off, a difference voltage Vrck−Vrf0 between the voltage level Vrck of the third reference voltage Vrc' and the initial level Vrf0 of the second ramp voltage Vrf is held in the capacitative element C3.

At a time t8, when the external input signal C_PH showing that the first conversion process is being executed becomes L level, the switch circuit SW2 to set whether or not the first ramp voltage Vrc can be inputted is turned off and the first conversion process is completed.

Then, at a time t12, the switch circuit SW4 is turned on for the second conversion process, and the second conversion process is started. In the second conversion process, the second ramp voltage generator circuit 22 generates the second ramp voltage Vrf which monotonously decreases step-by-step by a second change amount $\Delta V2$, in synchronization with the clock signal CLK. The counter circuit 40 counts down from a maximum value (three in this case) of the lower-order bits by one in synchronization with the clock signal CLK, and outputs a digital value Cl [(y−1):0] (y represents the bit number of lower-order bits, or 2 in this embodiment) as a calculation result. In addition, a voltage level Vrfh (h=Cl) of the second ramp voltage Vrf is Vrf0−$\Delta V2 \times$Cl provided by subtracting the second change amount $\Delta V2 \times$counter value Cu from the initial level Vrf0.

In addition, at the time t12, when the switch circuit SW4 is turned on, short circuit is caused between the first divided node ND1 and the second divided node ND2 of the second intermediate node N2 to be electrically connected to each other. Therefore, as shown in FIG. 6, after the time t12, the voltage levels of the first divided node ND1 and the second divided node ND2 become the same level. Since the switch circuit SW2 is in off state and the switch circuit SW4 is in on state in the second conversion process, the voltage levels of the first divided node ND1 and the second divided node ND2 decrease every time the second ramp voltage Vrf inputted to the third capacitative element C3 decreases.

At a time t10, the voltage level of the signal inputted to the voltage comparator circuit CMP becomes smaller than the threshold voltage value Vth, and the output level of the voltage comparator circuit CMP shifts from L level to H level. The digital value Cl [(y−1):0] (y represents the bit number of lower-order bits, or 2 in this embodiment) at this time is a conversion result of the lower-order bits and stored in the lower-order bit memory region 52. In addition, similar to the first conversion process, the time it takes for the level of the output signal Vcp of the voltage comparator circuit CMP to be inverted differs according to the solid-state imaging element PIX in the second conversion process.

Here, according to this embodiment, it is desirable that the first ramp voltage Vrc used in the first conversion process and the third reference voltage Vrc' to generate the voltage used in the second conversion process are at the same level in the A/D converter unit 60. However, even when an offset voltage Ve (=Vrc0'−Vrc0) is generated in the third reference voltage Vrc' with respect to the first ramp voltage Vrc, and an error is generated in the conversion results in the first conversion process and the second conversion process, the error is generated in common in all the A/D converter units 60 because the third reference voltage Vrc' are inputted in common to all the A/D converter units 60, so that the offset component appears on the whole screen and it is not recognized as a noise visually.

The following formula 10 and formula 11 show an input voltage Vin of the voltage comparator circuit CMP in the second conversion process when the offset voltage Ve is considered, in the circuit 100B of the present invention. In addition, a voltage level Vrck' is a voltage level of the third reference voltage Vrc' during a normal period after the output change of the voltage comparator circuit CMP in the first conversion process. In addition, the voltage level Vrc0' is the initial voltage level of the third reference voltage Vrc'.

$$Vin = Vrf + (Vrck' - Vrf0) + (Vsig - Vrc0) + (Vth - Vrst) \quad (10)$$

$$Vin - Vth = Vrf - \{Vrf0 + (Vrst - Vsig) - (Vrck' - Vrc0)\} \quad (11)$$

$$= Vrf - \left\{ \begin{array}{c} Vrf0 - \\ ((Vrck - Vrc0) - (Vrst - Vsig)) - \\ (Vrc0' - Vrc0) \end{array} \right\}$$

Therefore, based on the formula 11 and FIG. 6, the second ramp voltage Vrf at the time of the output change of the voltage comparator circuit CMP in the case where the offset voltage Ve is generated in the second conversion process in the circuit 100B of the present invention is expressed by the following formula 12. In addition, ΔV=(Vrck−Vrc0)−(Vrst−Vsig)=ΔVrc−Va, and the offset voltage Ve=Vrc0'−Vrc0

$$Vrf = Vrf0 - \{(Vrck - Vrc0) - (Vrst - Vsig)\} - (Vrc0' - Vrc0) \quad (12)$$

$$= Vrf0 - \Delta V - Ve$$

In addition, while the first ramp voltage generator circuit 23 is configured to output the first ramp voltage Vrc as the first reference voltage, and the first ramp voltage Vrc as the third reference voltage in this embodiment, the present invention is not limited to this. For example, when the same first ramp voltage Vrc is used as the first reference voltage and the third reference voltage, the first ramp voltage generator circuit 23 having the same configuration as that of the first embodiment may be used, and the first reference voltage Vrc may be branched and inputted to the switch circuit SW2 and the switch circuit SW5 in the A/D converter unit 60. In addition, when the first ramp voltage generator circuit 23 is configured to output the first ramp voltage Vrc as the first reference voltage and the first ramp voltage Vrc as the third reference voltage to the electrically separated nodes, the noise of the first ramp voltage Vrc does not interfere with that of the third reference voltage Vrc'.

Third Embodiment

A description will be made of a circuit of the present invention and a device of the present invention according to a third embodiment, with reference to FIG. 7B. In addition, according to this embodiment, a description will be made of a case where a configuration of a second ramp voltage Vrf is different from that in the first embodiment and the second embodiment. Here, FIG. 7B shows the configuration of the second ramp voltage Vrf according to this embodiment, and FIG. 7A shows the second ramp voltage Vrf in the first embodiment and the second embodiment to compare with the second ramp voltage Vrf according to this embodiment.

First, a brief description will be made of configurations of a circuit 100A of the present invention and a device 1 of the present invention with reference to the drawings. As shown in FIG. 1, similar to the first embodiment, the device 1 of the present invention is composed of, on the same chip, a solid-state imaging element group IPD, a plurality of A/D converter units 10 each provided with respect to each column of the solid-state imaging element group IPD, a memory circuit 50, and those provided with respect to the solid-state imaging element group IPD, such as a first ramp voltage generator circuit 21, a second ramp voltage generator circuit 22, a control signal generator circuit 30, a counter circuit 40, a vertical decoder VD, and a horizontal decoder HD. In addition, according to this embodiment, configurations of components in the device 1 of the present invention except for the second ramp voltage generator circuit 22, such as the solid-state imaging element group IPD, the A/D converter unit 10, the memory circuit 50, the first ramp voltage generator circuit 21, the control signal generator circuit 30, the counter circuit 40, the vertical decoder VD, and the horizontal decoder HD are the same as those in the first embodiment. In addition, according to this embodiment, while a description will be made assuming that the configurations of the components in the device 1 of the present invention except for the second ramp voltage generator circuit 22 are the same as those in the first embodiment, the configurations may be the same as those in the second embodiment.

The circuit 100A of the present invention according to this embodiment is a sub-ranging A/D converter circuit to execute a two-step conversion process composed of a first conversion process to find a value of upper-order bits and a second conversion process to find a value of lower-order bits, similar to the first and second embodiments, and similar to the first embodiment, as shown in FIGS. 4 and 5, it is composed of the A/D converter unit 10, the memory circuit 50, the first ramp voltage generator circuit 21, the second ramp voltage generator circuit 22, the control signal generator circuit 30, and the counter circuit 40.

Figure 7:
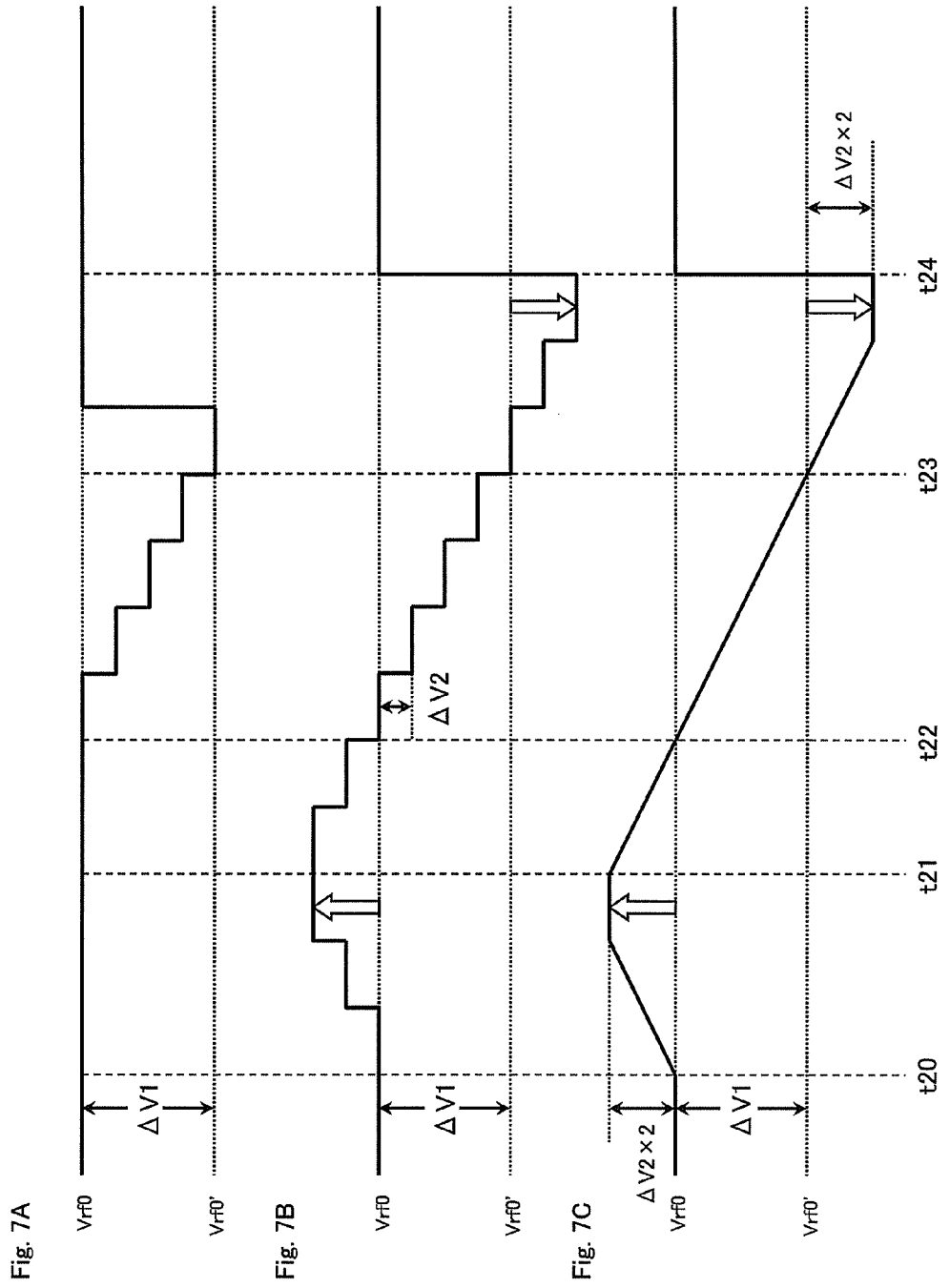
FIG. 7 is a schematic waveform diagram showing a schematic voltage waveform example of a second ramp voltage in another embodiment of an A/D converter circuit according to the present invention.
Figure 8:
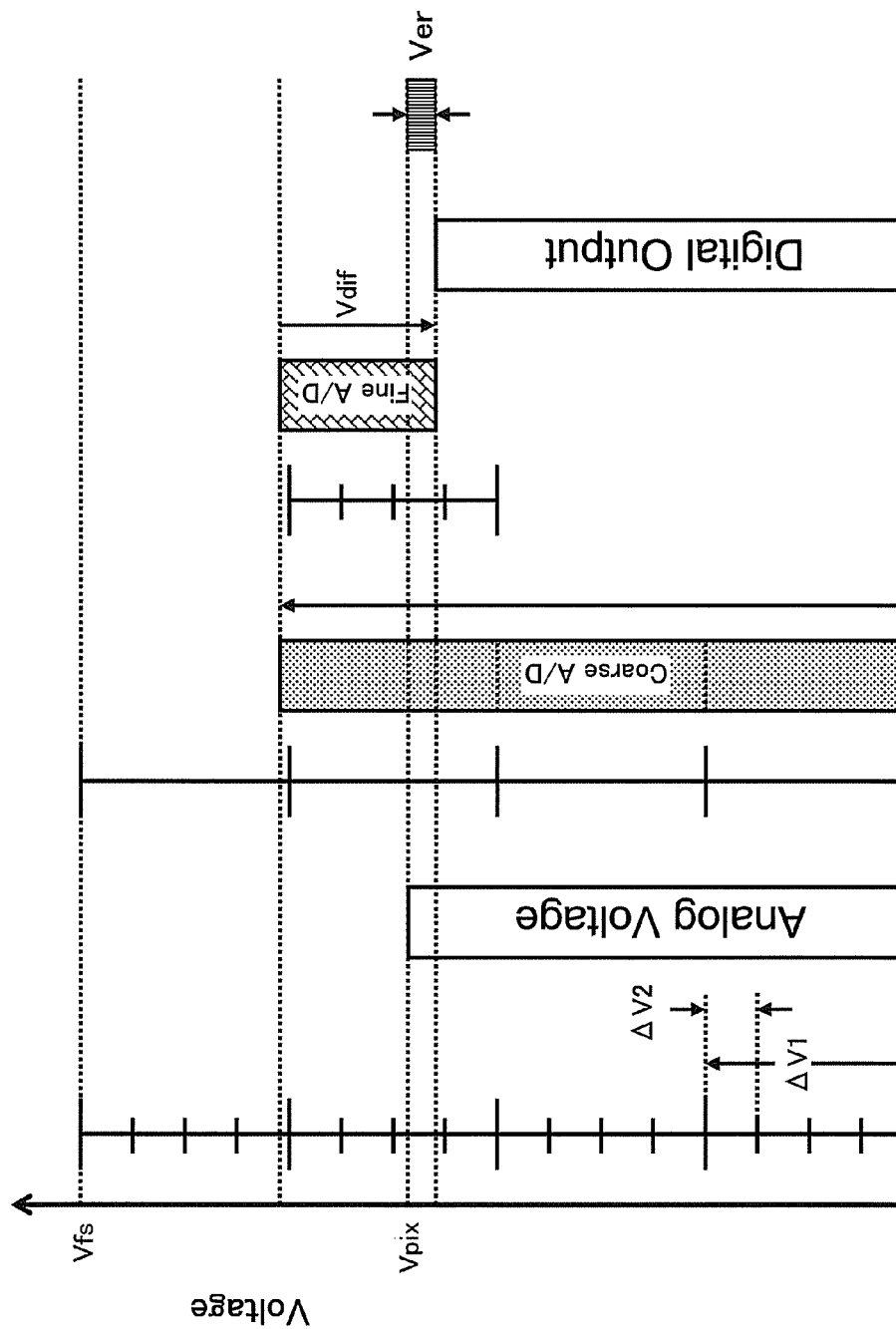
FIG. 8 is an explanatory view showing a relationship of each voltage of a general sub-ranging column-parallel A/D converter circuit.
Figure 9:
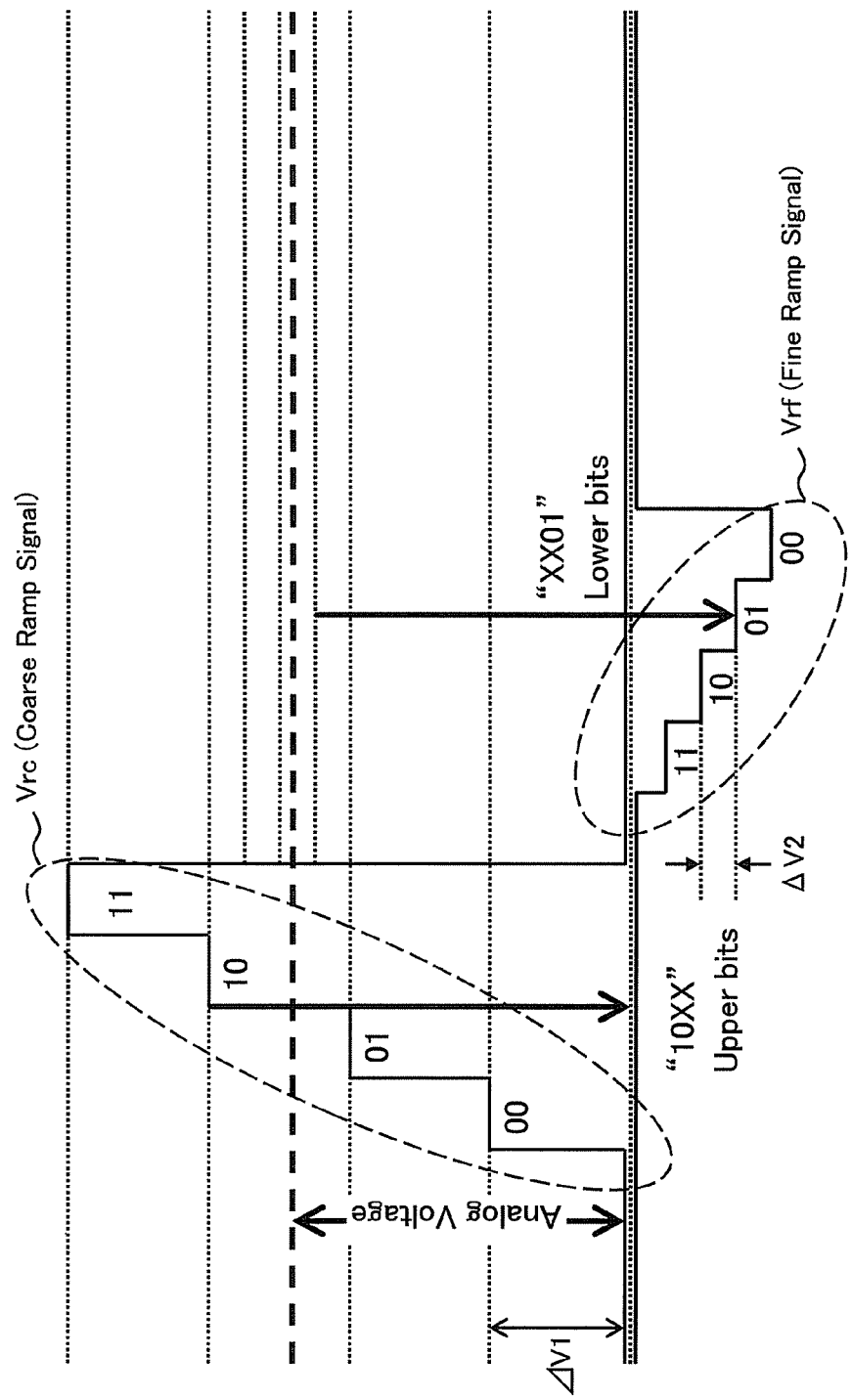
FIG. 9 is a waveform diagram showing a schematic configuration example of a ramp voltage used in the general sub-ranging column-parallel A/D converter circuit.
Figure 10:
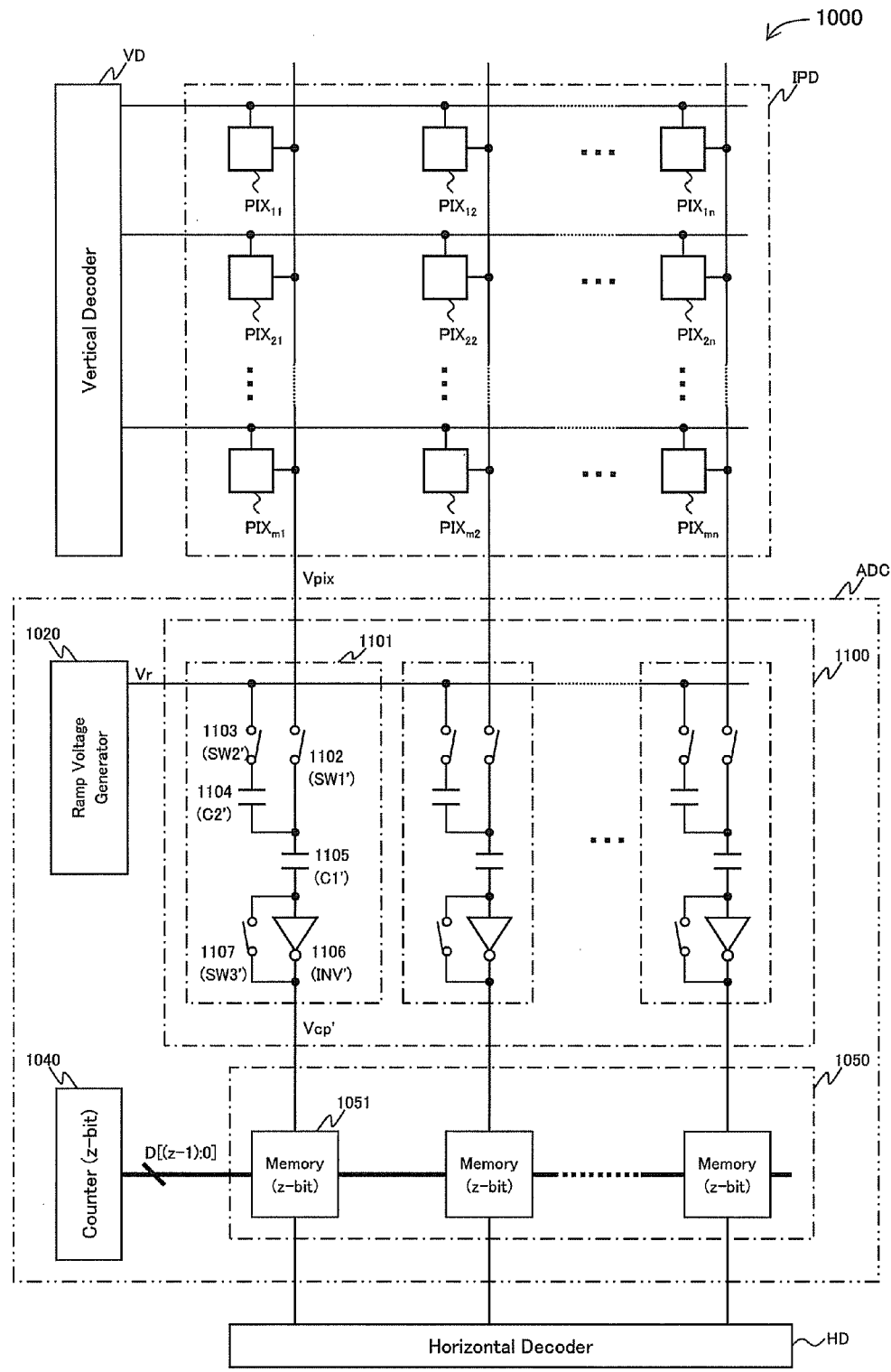
FIG. 10 is a schematic partial circuit diagram showing a schematic configuration example of a solid-state imaging device according to a conventional technique.
Figure 11:
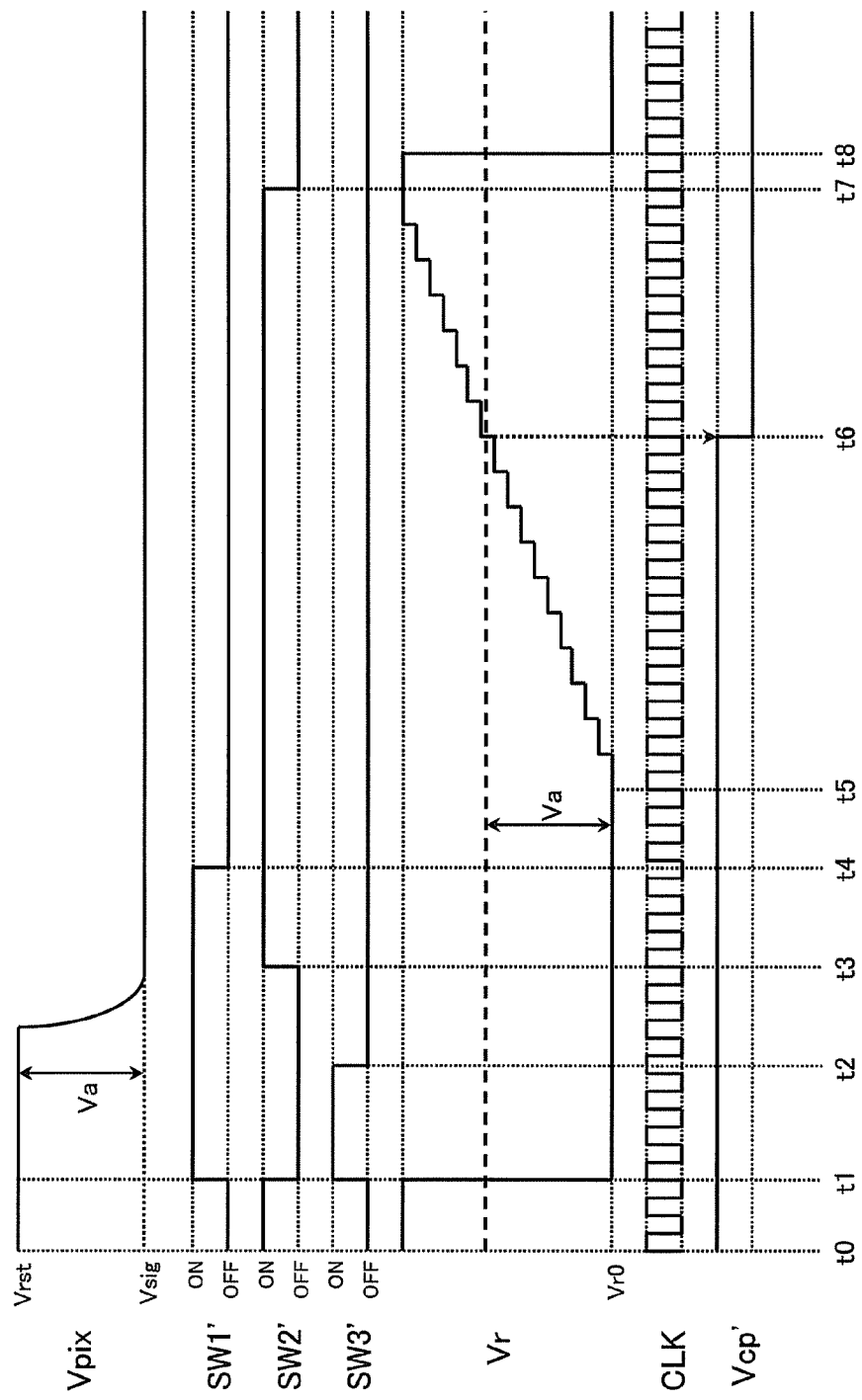
FIG. 11 is a waveform diagram showing signal waveforms and an internal state in a column-parallel A/D converter circuit according to the conventional technique.
Figure 12:
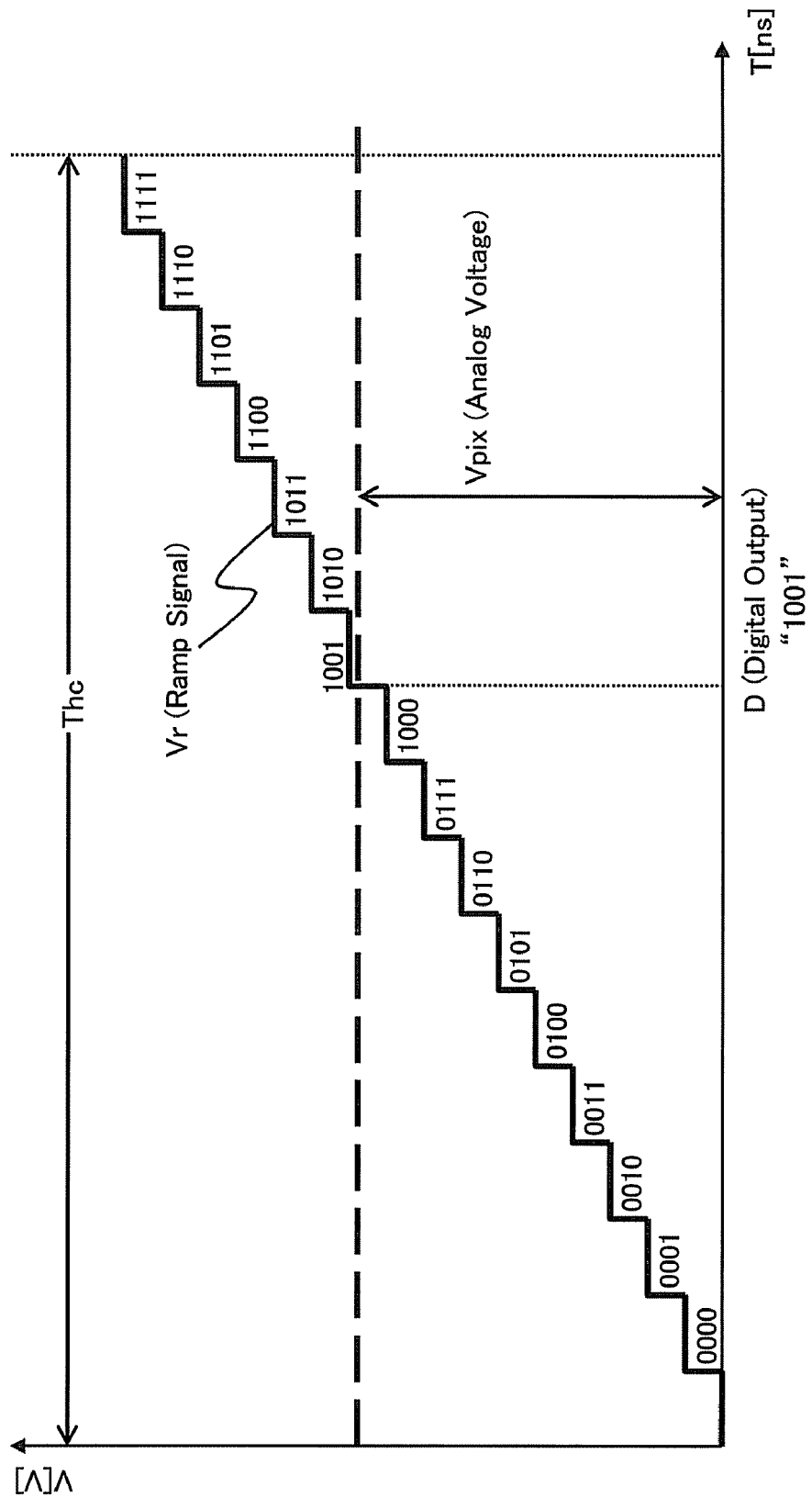
FIG. 12 is a waveform diagram showing a schematic configuration example of a ramp voltage used in the column-parallel A/D converter circuit according to the conventional technique.
Figure 13:
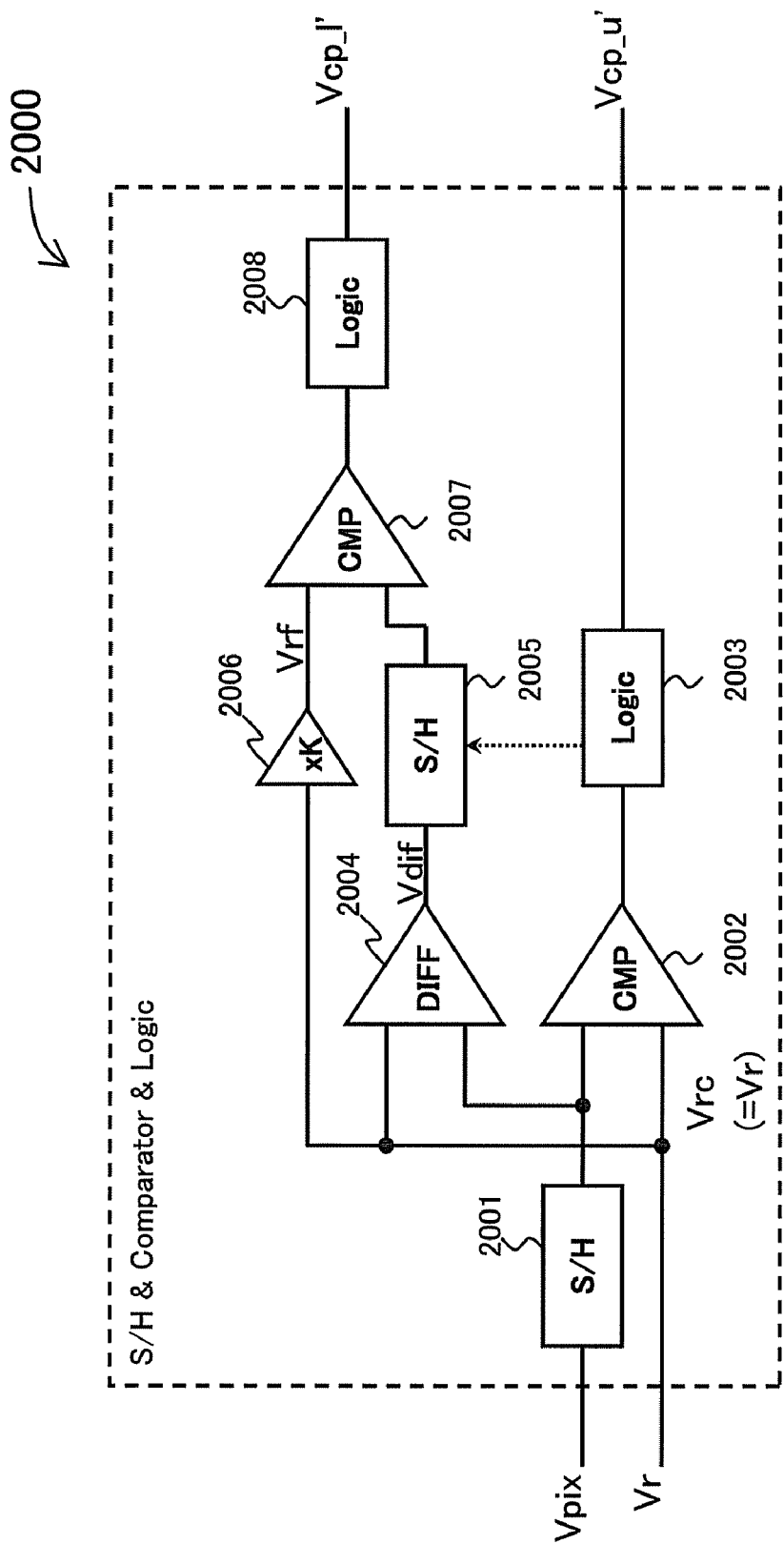
FIG. 13 is a schematic partial circuit diagram showing a schematic configuration example of a sub-ranging column-parallel A/D converter circuit internally containing a difference detection circuit according to a conventional technique.
Figure 14:
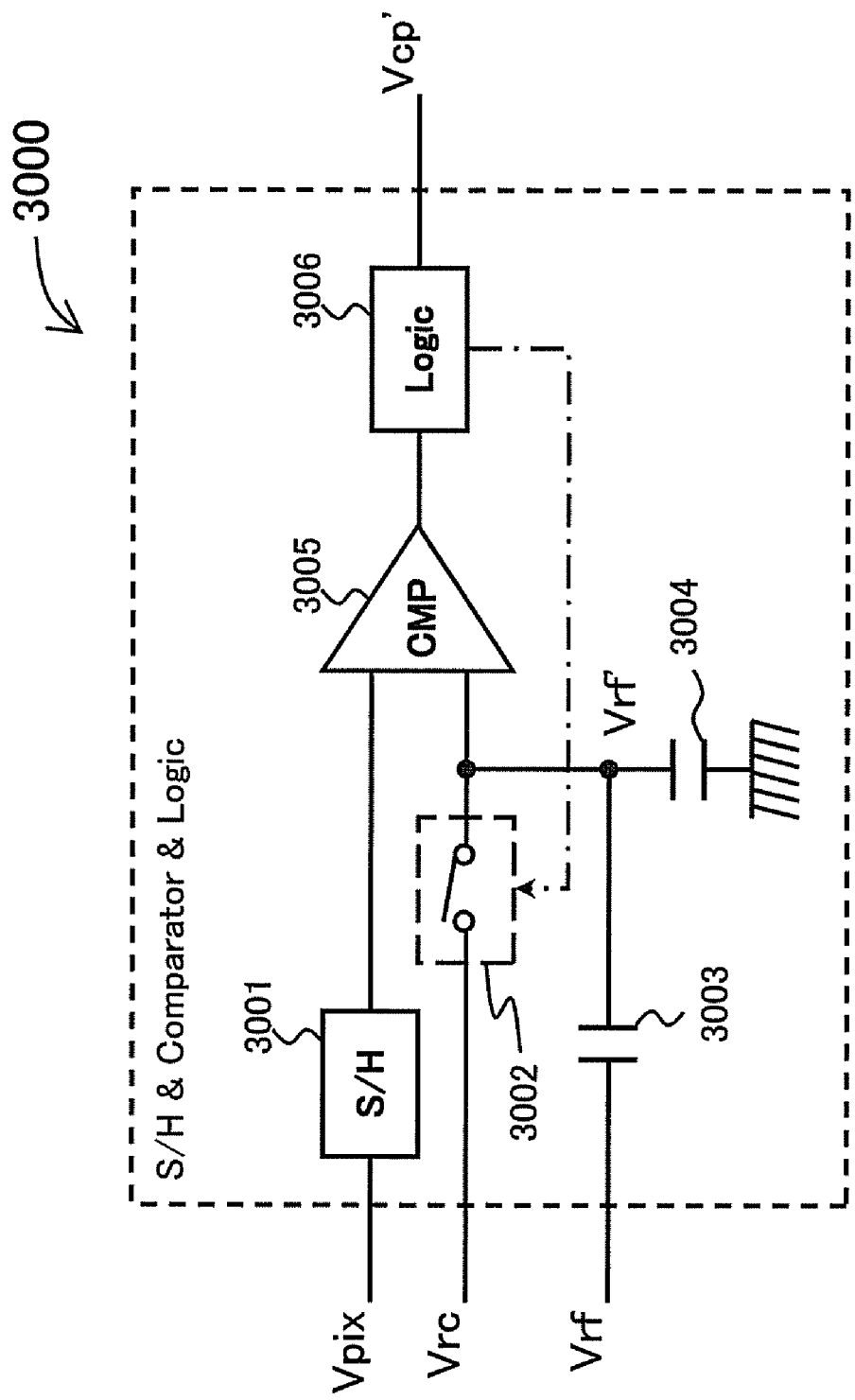
FIG. 14 is a schematic partial circuit diagram showing a schematic configuration example of a sub-ranging column-parallel A/D converter circuit using a capacity ratio according to a conventional technique.
Figure 15:
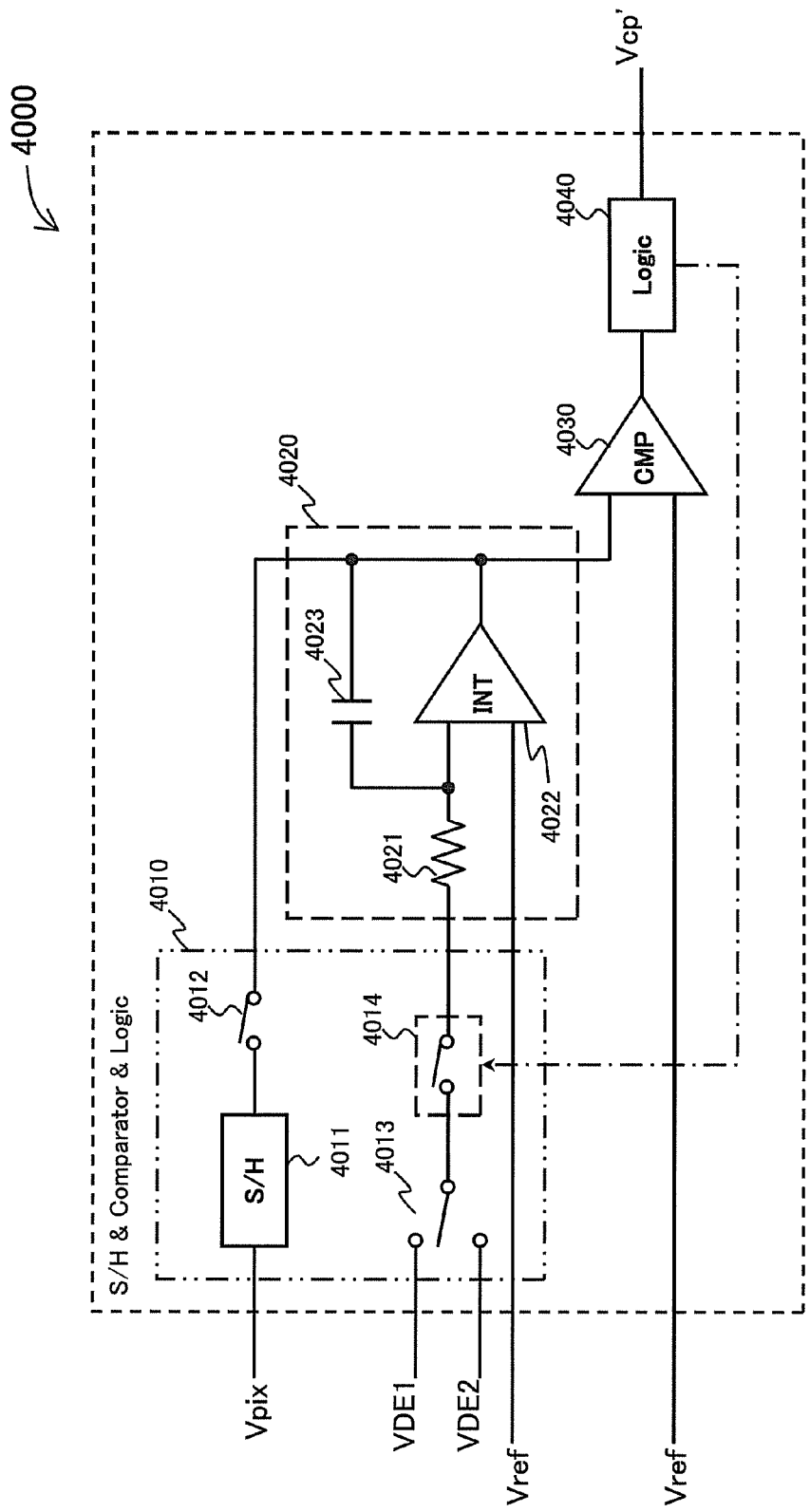
FIG. 15 is a schematic partial circuit diagram showing a schematic configuration example of a sub-ranging column-parallel A/D converter circuit internally containing an integration circuit according to a conventional technique.
Figure 16:
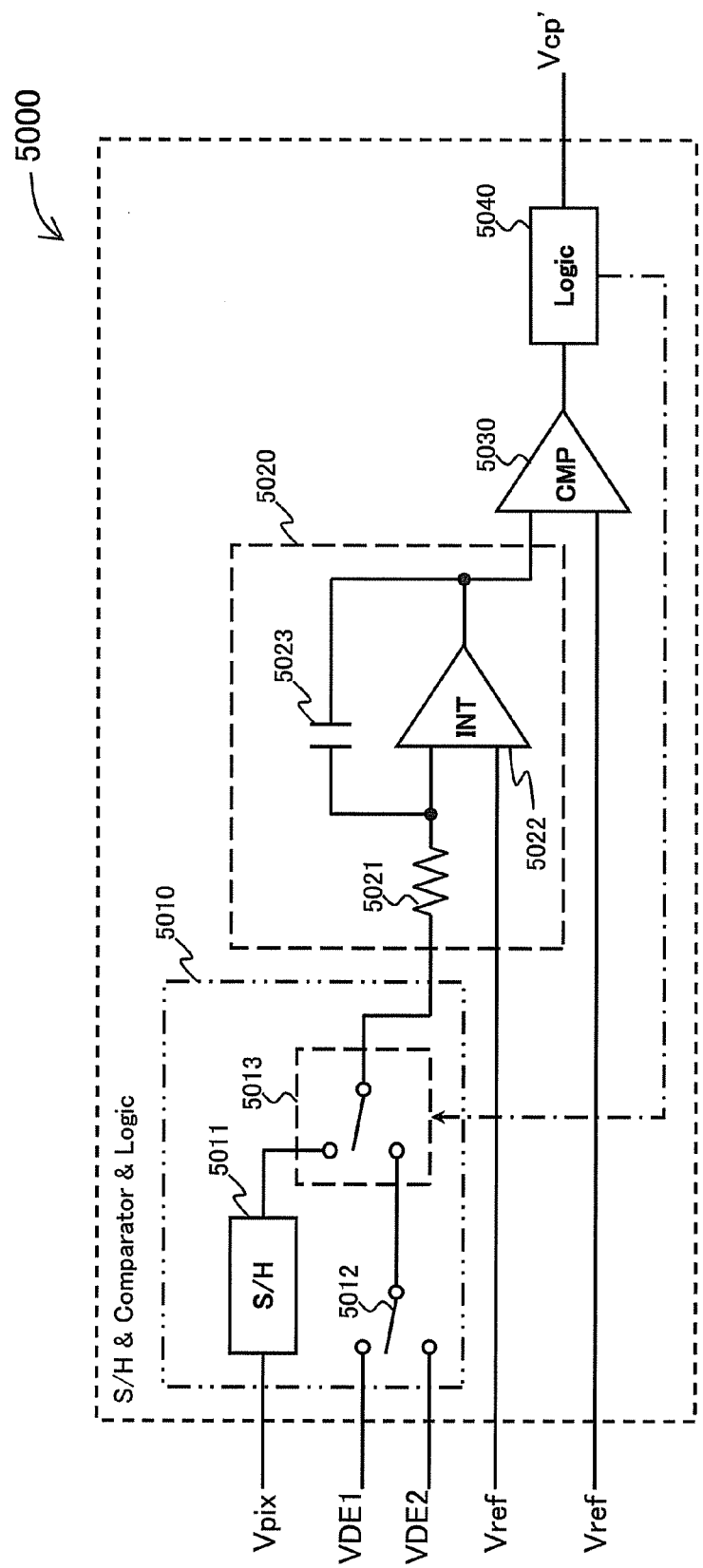
FIG. 16 is a schematic partial circuit diagram showing a schematic configuration example of a sub-ranging column-parallel A/D converter circuit internally containing an integration circuit according to a conventional technique.

The second ramp voltage generator circuit 22 according to this embodiment is configured in such a manner that a total amount of the second change amounts ΔV2 (=ΔV2×8) in a period during which the voltage value of the second ramp voltage Vrf monotonously and sequentially changes step-by-step, that is, in a period between a time t21 and a time t24 in FIG. 7B, is set to be larger than the first $\Delta V1$ (=$\Delta V2 \times 4$), and the second ramp voltage Vrf is generated and outputted in a period including a given period just before the second conversion process (a period between the time t21 and the time t22 in FIG. 7B) and a given period just after the second conversion process (a period between the time t23 and the time t24 in FIG. 7B), in addition to the execution period (a period between the time t22 and the time t23 in FIG. 7B) of the second conversion process.

More specifically, the second ramp voltage generator circuit 22 according to this embodiment, as shown in FIG. 7B, generates the second ramp voltage Vrf which monotonously decreases by the second change amount $\Delta V2$ from a voltage level higher than the initial level Vrf0 by twice the second change amount $\Delta V2$, to a voltage level lower than the initial level Vrf0 by the first change amount $\Delta V1$ and twice the second change amount $\Delta V2$. In addition, a voltage width in the period (the time t21 to the time t24) during which the second ramp voltage Vrf sequentially and monotonously decreases step-by-step is provided by the following formula: $\Delta V2 \times 2 + \Delta V1 + \Delta V2 \times 2 = \Delta V2 \times 8$ in this embodiment, but it can be optionally set.

Typically, when the difference voltage $\Delta V$ between a difference voltage Va between the reset level Vrst and the pixel level Vsig of the conversion object analog voltage signal Vpix, and the voltage level Vrck held at the time of the output change of the voltage comparator circuit CMP in the first conversion process is extremely small or becomes a negative voltage (Va>Vrck), or when the difference voltage $\Delta V$ is higher than the change amount (full-scale) of the second ramp voltage in the period during which the second conversion process is executed (the time t22 to the time t23), the input level of the voltage comparator circuit CMP does not reach the threshold voltage value Vth and its output level is not inverted in the period between the time t22 and the time t23 during which the detection result of the second conversion process can be obtained. However, by configuring the second ramp voltage Vrf as described above, even in such a condition, the input level of the voltage comparator circuit CMP can reach the threshold voltage value Vth in the period between the time t21 to the time t24, so that conversion accuracy can be effectively prevented from degrading.

Fourth Embodiment

A description will be made of a circuit of the present invention and a device of the present invention according to a fourth embodiment, with reference to FIG. 7C. In addition, according to this embodiment, a description will be made of a case where a configuration of a second ramp voltage Vrf is different from those in the first to third embodiments. Here, FIG. 7C shows the configuration of the second ramp voltage Vrf according to this embodiment, and FIG. 7A shows the second ramp voltage Vrf in the first embodiment and the second embodiment to compare with the second ramp voltage Vrf according to this embodiment.

First, a brief description will be made of configurations of a circuit 100A of the present invention and a device 1 of the present invention with reference to the drawings. As shown in FIG. 1, similar to the first embodiment, the device 1 of the present invention is composed of, on the same chip, a solid-state imaging element group IPD, a plurality of A/D converter units 10' each provided with respect to each column of the solid-state imaging element group IPD, a memory circuit 50, and those provided with respect to the solid-state imaging element group IPD, such as a first ramp voltage generator circuit 21, a second ramp voltage generator circuit 22, a control signal generator circuit 30, a counter circuit 40, a vertical decoder VD, and a horizontal decoder HD. In addition, according to this embodiment, configurations of the components in the device 1 of the present invention except for the second ramp voltage generator circuit 22, such as the solid-state imaging element group IPD, the A/D converter unit 10, the memory unit 50, the first ramp voltage generator circuit 21, the control signal generator circuit 30, the counter circuit 40, the vertical decoder VD, and the horizontal decoder HD are the same as those in the first embodiment. In addition, according to this embodiment, while a description will be made assuming that the configurations of the components in the device 1 of the present invention except for the second ramp voltage generator circuit 22 are the same as those in the first embodiment, the configurations may be the same as those in the second embodiment.

Similar to the first and second embodiments, the circuit 100A of the present invention according to this embodiment is a sub-ranging A/D converter circuit to execute a two-step conversion process composed of first conversion process to find a value of upper-order bits and a second conversion process to find a value of lower-order bits, and similar to the first embodiment, as shown in FIGS. 4 and 5, it is composed of the A/D converter unit 10, the memory circuit 50, the first ramp voltage generator circuit 21, the second ramp voltage generator circuit 22, the control signal generator circuit 30, and the counter circuit 40.

The second ramp voltage generator circuit 22 according to this embodiment is configured to generate the second ramp voltage Vrf which monotonously and sequentially changes. In addition, according to this embodiment, the second ramp voltage Vrf is generated and outputted in a period including a given period just before the second conversion process (a period between a time t21 and a time t22 in FIG. 7C) and a given period just after the second conversion process (a period between the time t23 and the time t24 in FIG. 7C), in addition to the execution period (a period between the time t22 and the time t23 in FIG. 7C) of the second conversion process.

More specifically, the second ramp voltage generator circuit 22 according to this embodiment, as shown in FIG. 7C, generates the second ramp voltage Vrf which monotonously decreases from a voltage level higher than an initial level Vrf0 by twice the second change amount $\Delta V2$, to a voltage level lower than the initial level Vrf0 by the first change amount $\Delta V1$ and twice the second change amount $\Delta V2$. In addition, according to this embodiment, as shown in FIG. 7C, while the second ramp voltage of $\Delta V2 \times 2$ is generated in each of the given period just before the second conversion process and the given period after the second conversion process, the change amount of the second ramp voltage can be optionally set. Similarly, while a voltage width in the period (the time t21 to the time t24) during which the second ramp voltage Vrf sequentially and monotonously decreases is provided by the following formula $\Delta V2 \times 2 + \Delta V1 + \Delta V2 \times 2 = \Delta V2 \times 8$ in this embodiment, but it can be optionally set.

By configuring the second ramp voltage Vrf to sequentially and monotonously change, linearity of the second ramp voltage Vrf can be more preferably provided. Since the second ramp voltage Vrf is superior in linearity, the conversion accuracy can be preferably maintained when it is necessary to set the resolution to a very high value in the second conversion process. In addition, since a first ramp voltage Vrc is used not only in the first conversion process to find the value of upper-order bits but also in the sampling and holding process to hold the voltage used in the second conversion process, it preferably monotonously changes step-by-step.

Another Embodiment (1) While the clock signal CLK and the clock signal SCL having the same frequency are used in the first conversion process and the second conversion process in the descriptions of the first to fourth embodiments, a clock signal faster than a clock signal used in the first conversion process may be used in the second conversion process.

In addition, as described above, the first ramp voltage (third reference voltage) is used in the first conversion process to find the value of the upper-order bits and in the sampling and holding process to hold the voltage used in the second conversion process, and the frequency of the clock signal to generate the first ramp voltage is determined in view of the settling time of the voltages at the input end and the output end of the capacitative element C3 used in the sampling and holding process. Meanwhile, the second ramp voltage is used in the second conversion process to find the value of the lower-order bits, and it is not used in the sampling and holding process unlike the first ramp voltage. Therefore, as for the clock signal to generate the second ramp voltage, it is not necessary to consider the settling time of the voltage at the input end and the output end of the cap acitative element C3 in the sampling and holding process, so that its frequency can be set to be higher than that of the first ramp voltage. When the frequency of the clock signal to generate the second ramp voltage is set to be higher than that of the clock signal to generate the first ramp voltage, the time taken for the second conversion process can be shortened, so that a process time of the A/D conversion process in the circuit of the present invention and the device of the present invention can be shortened as a whole.

(2) According to the first to fourth embodiments, the memory circuit 50 is configured in such a manner that when the output level of the voltage comparator circuit CMP shifts from H level to L level, the digital value Cu outputted from the counter circuit 40 is stored in the upper-order bit memory region 51, and when the output level of the voltage comparator circuit CMP shifts from L level to H level, the digital value Cl outputted from the counter circuit 40 is stored in the lower-order bit memory region 52, but the present invention is not limited to the above configuration.

It may be configured in such a manner that when the output level of the voltage comparator circuit CMP shifts from L level to H level, the digital value Cu outputted from the counter circuit 40 is stored in the upper-order bit memory region 51, and when the output level of the voltage comparator circuit CMP shifts from H level to L level, the digital value Cl outputted from the counter circuit 40 is stored in the lower-order bit memory region 52.

In addition, the memory circuit 50 may be configured in such a manner that one memory circuit provided with a memory region capable of storing digital data for one row is provided, and the memory region of the memory circuit is divided into the upper-order bit memory region 51 and the lower-order bit memory region 52 with respect to each column. In addition, the upper-order bit memory region 51 with respect to each column may be configured by combining the memory regions of the plurality of memory circuits, and similarly, the lower-order bit memory region 52 with respect to each column may be provided by combining the memory regions of the plurality of memory circuits.

The invention claimed is:

1. An A/D converter circuit comprising:
a first capacitative element;
a second capacitative element having an output end connected to an input end of the first capacitative element;
a third capacitative element having an output end connected to an input end of the second capacitative element;
a voltage comparator circuit having an input terminal connected to an output end of the first capacitative element, configured to compare a voltage value of the input terminal with a predetermined threshold voltage value;
a first input circuit configured to input an externally inputted conversion object analog voltage signal to a first intermediate node provided between the first capacitative element and the second capacitative element;
a second input circuit configured to input a first reference voltage to a second intermediate node provided between the second cap acitative element and the third capacitative element, the first reference voltage being used for a first conversion process to find a value of sequential bits containing the most significant bit, in digital data provided after the conversion object analog voltage signal has been converted;
a third input circuit configured to input a second reference voltage to an input end of the third capacitative element, the second reference voltage being used for a second conversion process to find a value of unconverted bits in the digital data after the first conversion process;
a control circuit configured to generate a control signal to hold a voltage value of the first reference voltage in the third capacitative element when an output of the voltage comparator circuit changes in the first conversion process;
a first ramp voltage generator circuit configured to generate a first ramp voltage having a voltage value monotonously changing step-by-step, and output the first ramp voltage as the first reference voltage while at least the first conversion process is executed;
a second ramp voltage generator circuit configured to generate a second ramp voltage having a voltage value monotonously changing step-by-step or sequentially, and output the second ramp voltage as the second reference voltage while at least the second conversion process is executed;
a counter circuit configured to output a digital value counted in response to a change of the first ramp voltage and a change of the second ramp voltage; and
a memory circuit configured to store the digital value when the output of the voltage comparator circuit changes.

2. The A/D converter circuit according to claim 1, wherein the first input circuit includes a first switch circuit configured to set whether or not the conversion object analog voltage signal is inputted to the first intermediate node, and turns on the first switch circuit in a predetermined period before the counter circuit starts counting in the first conversion process,
the second input circuit includes a second switch circuit configured to set whether or not the first reference voltage is inputted to the second intermediate node, and turns on the second switch circuit in the first conversion process, and
the third input circuit includes a third switch circuit configured to set whether or not the second reference voltage is inputted to the third capacitative element, and turns off the third switch circuit in a period from when the output of the voltage comparator circuit changes to when the second conversion process starts, based on the control signal.

3. The A/D converter circuit according to claim 1, wherein
the first input circuit includes a first switch circuit configured to set whether or not the conversion object analog voltage signal is inputted to the first intermediate node, and turns on the first switch circuit in a predetermined period before the counter circuit starts counting in the first conversion process, the second input circuit includes a fourth switch circuit configured to divide the second intermediate node into a first divided node on a side of the second capacitative element and a second divided node on a side of the third capacitative element in order to control an electric connection between the second capacitative element and the third capacitative element, a second switch circuit configured to set whether or not the first reference voltage is inputted to the first divided node, and a fifth switch circuit configured to set whether or not a third reference voltage such as the first reference voltage or a voltage corresponding to the first reference voltage is inputted to the second divided node, and is configured to turn on the second switch circuit in the first conversion process, turn off the fourth switch circuit in the first conversion process, and turn on the fifth switch circuit in a period from when the counter circuit starts counting to when the output of the voltage comparator circuit changes in the first conversion process, based on the control signal, to hold the voltage value of the first reference voltage when the output of the voltage comparator circuit changes, in the third capacitative element, and the third input circuit is configured to directly input the second reference voltage to an input terminal of the third capacitative element.

4. The A/D converter circuit according to claim 1, wherein
the second ramp voltage generator circuit generates the second ramp voltage changing in an opposite direction to a change in the first ramp voltage in the first conversion process, in the second conversion process.

5. The A/D converter circuit according to claim 1, wherein
the voltage comparator circuit includes an inverter circuit, and a sixth switch circuit configured to cause short circuit between an input terminal and an output terminal of the inverter circuit, and short circuit is caused in the inverter circuit by the sixth switch circuit for initialization in a predetermined initialization period before the conversion object analog voltage signal is inputted to the first intermediate node by the first input circuit.

6. The A/D converter circuit according to claim 1, wherein
the control circuit controls an output timing of the control signal so as not to switch a switch circuit controlled by the control signal from when the first ramp voltage inputted to the third capacitative element changes to when a voltage value changing in response to a change in the first ramp voltage becomes stable at the input end and the output end of the third capacitative element, in the first conversion process.

7. The A/D converter circuit according to claim 1, wherein
the first ramp voltage monotonously changes step-by-step by a first change amount provided by dividing a voltage width of the conversion object analog voltage signal by a split number based on a first resolution previously set according to a bit number of the digital data, and the second ramp voltage monotonously changes step-by-step by a second change amount provided by dividing the first change amount by a split number based on a second resolution defined so that a sum of a value of a bit number corresponding to the second resolution and a value of a bit number corresponding to the first resolution is equal to a value of the bit number of the digital data.

8. The A/D converter circuit according to claim 1, wherein
the first ramp voltage monotonously changes step-by-step by a first change amount provided by dividing a voltage width of the conversion object analog voltage signal by a split number based on a first resolution previously set according to a bit number of the digital data, and the second ramp voltage sequentially and monotonously changes.

9. The A/D converter circuit according to claim 1, wherein
the second ramp voltage generator circuit generates and outputs the second ramp voltage in a period including one or both of a period just before the second conversion process and a period just after the second conversion process, in addition to an execution period of the second conversion process.

10. A solid-state imaging device comprising:
a solid-state imaging element group composed of a plurality of solid-state imaging elements arranged in a matrix and configured to convert an optical signal to an electric signal;

a first capacitative element, a second capacitative element, a third capacitative element, a voltage comparator circuit, a first input circuit, a second input circuit, a third input circuit, a control circuit, and memory circuits provided with respect to each column of the solid-state imaging element group; and a first ramp voltage generator circuit, a second ramp voltage generator circuit, and a counter circuit provided on the same chip with respect to the solid-state imaging element group, wherein the first capacitative element, the second capacitative element, the third capacitative element, the voltage comparator circuit, the first input circuit, the second input circuit, the third input circuit, the control circuit, the memory circuits, the first ramp voltage generator circuit, the second ramp voltage generator circuit, and the counter circuit constitute the A/D converter circuit according to any one of claims 1 to 9.

* * * * *